(12) United States Patent
Sako et al.

(10) Patent No.: US 9,046,910 B2
(45) Date of Patent: Jun. 2, 2015

(54) CONSTANT CURRENT GENERATION CIRCUIT AND MICROPROCESSOR INCLUDING THE SAME

(75) Inventors: Kazutoshi Sako, Kanagawa (JP); Tomokazu Matsuzaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 73 days.

(21) Appl. No.: 13/427,359

(22) Filed: Mar. 22, 2012

(65) Prior Publication Data

US 2012/0249114 A1 Oct. 4, 2012

(30) Foreign Application Priority Data

Mar. 31, 2011 (JP) .................................. 2011-078152

(51) Int. Cl.
| | |
|---|---|
| *G05F 3/30* | (2006.01) |
| *G05F 1/56* | (2006.01) |
| *H03L 1/02* | (2006.01) |
| *G05F 3/24* | (2006.01) |
| *H03K 3/0231* | (2006.01) |

(52) U.S. Cl.
CPC ................ *G05F 1/561* (2013.01); *H03L 1/022* (2013.01); *G05F 3/245* (2013.01); *H03K 3/0231* (2013.01)

(58) Field of Classification Search
USPC ......... 323/312, 316, 297, 298, 354, 349, 351, 323/907; 363/73; 327/513, 536, 539, 540
See application file for complete search history.

(56) References Cited

U.S. PATENT DOCUMENTS

| | | | | |
|---|---|---|---|---|
| 5,406,636 | A | * | 4/1995 | Yamada et al. ............... 381/106 |
| 6,477,090 | B2 | | 11/2002 | Yamaki et al. |
| 6,643,193 | B2 | | 11/2003 | Yamaki et al. |
| 7,498,884 | B2 | | 3/2009 | Kwon et al. |
| 7,602,273 | B2 | | 10/2009 | Yoshikawa |
| 8,278,996 | B2 | | 10/2012 | Miki et al. |
| 2008/0007355 | A1 | * | 1/2008 | Nakashima ...................... 331/57 |
| 2008/0246537 | A1 | * | 10/2008 | Aziz ............................ 327/540 |

(Continued)

FOREIGN PATENT DOCUMENTS

| | | |
|---|---|---|
| JP | 61-125621 | 6/1986 |
| JP | 03-087907 | 4/1991 |

(Continued)

OTHER PUBLICATIONS

Japanese Official Action—2011-078152—Jul. 22, 2014.

*Primary Examiner* — Matthew Nguyen
*Assistant Examiner* — Trinh Dang
(74) *Attorney, Agent, or Firm* — Young & Thompson

(57) ABSTRACT

A constant current generation circuit of the invention includes: a temperature variable voltage generation unit that generates a first variation voltage whose voltage value fluctuates with temperature; a variation gradient adjustment unit that generates a second variation voltage based on a reference voltage smaller in the amount of variation with temperature than the first variation voltage and the first variation voltage; and a current generation unit that includes a current setting resistor whose resistance value fluctuates with temperature and generates an output current based on the second variation voltage and the current setting resistor. The variation gradient adjustment unit sets the coefficient of variation with temperature of the second variation voltage so that the difference between it and the coefficient of variation with temperature of the resistance value of the current setting resistor is within a preset first stipulated range.

27 Claims, 14 Drawing Sheets

(56) References Cited

U.S. PATENT DOCUMENTS

| | | | |
|---|---|---|---|
| 2009/0128120 A1* | 5/2009 | Tatsuda | 323/351 |
| 2009/0174392 A1* | 7/2009 | Kadner | 324/76.11 |
| 2009/0238239 A1* | 9/2009 | Pan | 374/178 |
| 2010/0123514 A1* | 5/2010 | Le et al. | 327/539 |
| 2010/0188067 A1* | 7/2010 | Chang et al. | 323/313 |

FOREIGN PATENT DOCUMENTS

| | | |
|---|---|---|
| JP | 2001-175343 | 6/2001 |
| JP | 2002-074997 | 3/2002 |
| JP | 2005-286021 | 10/2005 |
| JP | 2005-333298 | 12/2005 |
| JP | 4460588 | 2/2010 |
| JP | 2011-053957 | 3/2011 |

* cited by examiner

CONSTANT CURRENT GENERATION CIRCUIT AND MICROPROCESSOR INCLUDING THE SAME

CROSS-REFERENCE TO RELATED APPLICATIONS

The disclosure of Japanese Patent Application No. 2011-78152 filed on Mar. 31, 2011 including the specification, drawings and abstract is incorporated herein by reference in its entirety.

BACKGROUND

The present invention relates to constant current generation circuits and microprocessors including them and in particular to a constant current generation circuit that outputs a current having a stable current value against variation of temperature and a microprocessor including it.

In the circuits of semiconductor devices, a constant current generation circuit that generates a constant current for setting the operating current of a circuit or the operating characteristics of a circuit is frequently utilized. (The examples of the operating characteristics include the oscillating frequency of an oscillation circuit, the delay time of a delay circuit, and the like.) Constant current generation circuits may be required to maintain a constant current value regardless of the temperature of a semiconductor substrate. This is because temperature variation in the operating characteristics of a circuit due to the temperature of a semiconductor substrate can be suppressed by taking the following measure: variation in output current (temperature variation in output current) due to the temperature of the semiconductor substrate is suppressed.

A technology for suppressing variation in output current due to the temperature of a semiconductor substrate as mentioned above is described in Patent Document 1. FIG. 17 is a block diagram of the RC oscillator described in Patent Document 1. In the RC oscillator 100 illustrated in FIG. 17, a bias circuit portion 101 outputs current IRAMP based on the resistance value of a resistor R. A ramp/hold circuit portion 102 generates voltage VHOLD having a gradient in proportion to the magnitude of current IRAMP.

In the RC oscillator 100, resistors Ra, Rb are coupled in series to form the resistor R. The resistance value of the resistor Ra is reduced as the temperature rises and the resistance value of the resistor Rb is increased as the temperature rises. That is, in the RC oscillator 100, the resistor R is configured by combining two resistors having such characteristics that their resistance values oppositely fluctuate with temperature; and fluctuation in the resistance value of the resistor R with temperature is thereby suppressed. In the RC oscillator 100, temperature variation in the current value of current IRAMP generated based on the resistance value of the resistor R is thereby suppressed.

A method in which temperature variation in the resistance value of an entire resistor is suppressed by combining two resistors having opposite fluctuation characteristics with temperature is also disclosed in Patent Documents 2 and 3.

[Patent Document 1]
  Japanese Patent No. 4460588
[Patent Document 2]
  Japanese Patent Application Publication No. 2005-286021
[Patent Document 3]
  Japanese Patent Application Publication No. 2005-333298

SUMMARY

In general, resistors different in temperature variation are formed in different semiconductor processes. Resistors different in temperature variation have different production tolerances. For this reason, when the resistance value of a combined resistance obtained by combining these resistors varies, it is necessary to trim either resistor to match the combined resistance with an expected value. In a circuit including a combined resistance, however, it is difficult to identify which resistor comprising the combined resistance should be trimmed when trimming is carried out because the circuit characteristics are determined by the resistance value of the entire combined resistance. For example, even though the resistance value of the combined resistance can be set to an expected value by trimming either resistor, the resistance ratio between the two resistors drifts. As a result, a problem of deviation of the temperature characteristic of the resistance value of the combined resistance from the expected value arises.

That is, in the technology described in Patent Document 1, it is difficult to trim a resistance value and this poses the following problem: it is impossible to eliminate deviation of the temperature characteristic of current IRAMP based on the respective production tolerances of resistors comprising a combined resistance (resistor R). Patent Documents 2 and 3 also involve a problem that it is impossible to eliminate deviation of circuit characteristics based on the respective production tolerances of resistors comprising a combined resistance.

According to an aspect of the invention, a constant current generation circuit includes: a temperature variable voltage generation unit that generates a first variation voltage whose voltage value fluctuates with temperature; a variation gradient adjustment unit that generates a second variation voltage based on a reference voltage smaller in the amount of variation with temperature than the first variation voltage and the first variation voltage; and a current generation unit that includes a current setting resistor whose resistance value fluctuates with temperature and generates an output current based on the second variation voltage and the current setting resistor. The variation gradient adjustment unit sets the coefficient of variation with temperature of the second variation voltage so that the following is implemented: the difference between it and the coefficient of variation with temperature in the resistance value of the current setting resistor falls within a preset first stipulated range.

According to another aspect of the invention, a microprocessor includes: a memory in which a program and a set value are stored; a computing core that carries out computation processing based on the program stored in the memory; and a constant current generation circuit. The constant current generation circuit includes: a temperature variable voltage generation unit that generates a first variation voltage whose voltage value fluctuates with temperature; a variation gradient adjustment unit that generates a second variation voltage based on a reference voltage smaller in the amount of variation with temperature than the first variation voltage and the first variation voltage; and a current generation unit that includes a current setting resistor whose resistance value fluctuates with temperature and generates an output current based on the second variation voltage and the current setting resistor. The variation gradient adjustment unit sets the coefficient of variation with temperature of the second variation voltage so that the following is implemented: the different between it and the coefficient of variation with temperature in the resistance value of the current setting resistor falls within a preset first stipulated range.

In a constant current generation circuit and a microprocessor including it according to the aspects of the invention, the following can be implemented: temperature variation in output current can be suppressed just by a variation gradient adjustment unit adjusting the coefficient of variation (gradient) in second variation voltage. More specific description will be given. In a constant current generation circuit and a microprocessor including it of the invention, there is only one item for adjusting temperature variation in output current. Therefore, increase in temperature variation in output current can be prevented by adjustment processing.

In a constant current generation circuit and a microprocessor including it according to the aspects of the invention, temperature variation in output current can be adequately improved by adjustment processing.

DETAILED DESCRIPTION

First Embodiment

Figure 1:
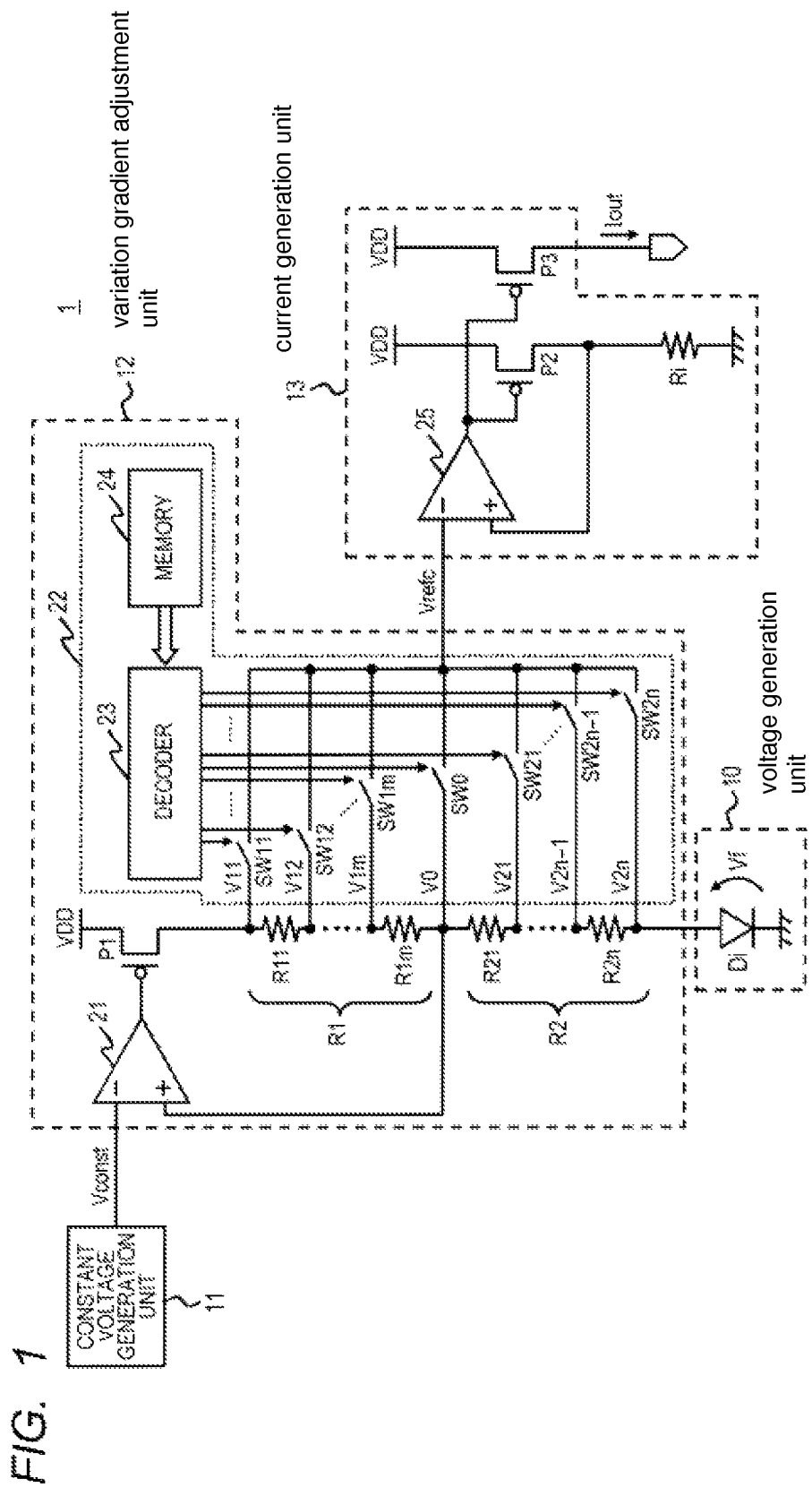
FIG. 1 is a block diagram of a constant current generation circuit in a first embodiment.

Hereafter, description will be given to embodiments of the invention with reference to the drawings. FIG. 1 is a block diagram of a constant current generation circuit 1 in the first embodiment. As illustrated in FIG. 1, the constant current generation circuit 1 includes a temperature variable voltage generation unit 10, a constant voltage generation unit 11, a variation gradient adjustment unit 12, and a current generation unit 13.

The temperature variable voltage generation unit 10 generates a first variation voltage whose voltage value fluctuates with temperature. In this embodiment, the temperature variable voltage generation unit 10 includes a diode Di and outputs the forward voltage Vf of the diode Di as first variation voltage. (This voltage will be hereafter referred to as first variation voltage Vf.) The diode has its cathode coupled to a second power supply terminal (for example, ground terminal) and generates the first variation voltage at its anode. The first variation voltage Vf generated by the diode Di is the forward voltage of the diode and has a coefficient of variation of −2 mV/° C. or so (temperature characteristic negative to temperature). The temperature variable voltage generation unit 10 may generate a first variation voltage having a positive temperature characteristic. The coefficient of variation with temperature of the first variation voltage can be set according to the characteristics of a utilized element or circuit.

The constant voltage generation unit 11 generates a reference voltage Vconst smaller in the amount of variation with temperature than the first variation voltage. In this embodiment, a band-gap voltage source that generates the reference voltage Vconst based on a band-gap voltage is used for the constant voltage generation unit 11. This reference voltage Vconst is far smaller in variation with temperature than the first variation voltage and is substantially constant to temperature. The reference voltage Vconst may be generated by a circuit (for example, resistance voltage dividing circuit or the like) other than a band-gap voltage source.

The variation gradient adjustment unit 12 generates a second variation voltage Vrefc based on the reference voltage Vconst and the first variation voltage Vf. At this time, the variation gradient adjustment unit 12 sets the following difference within a preset first stipulated range: the difference between the coefficient of variation with temperature of the second variation voltage Vrefc and the coefficient of variation with temperature of the resistance value of the current setting resistor Ri described later. The variation gradient adjustment unit 12 includes at least either of a first gradient voltage generation unit that generates multiple first voltages and a second gradient voltage generation unit that generates multiple second voltages. Each of the first voltages has a gradient of a second temperature characteristic whose gradient is opposite to a first temperature characteristic and they have different coefficients of variation with temperature. Each of the second voltages has a gradient of the first temperature characteristic and they have different coefficients of variation with temperature. In the variation gradient adjustment unit 12, the first variation voltage Vf has a gradient of the first temperature characteristic. When the resistance value of the current setting resistor Ri has a gradient of the second temperature characteristic, the variation gradient adjustment unit takes one voltage selected from among the first voltages as second variation voltage Vrefc. When the first variation voltage Vf and the resistance value of the current setting resistor Ri have a gradient of the first temperature characteristic, the variation gradient adjustment unit 12 takes one voltage selected from among the second voltages as second variation voltage Vrefc. The current setting resistor Ri is a resistor provided in the current generation unit 13 described later. The following description is based on the assumption that: the first temperature characteristic is of a negative gradient (a gradient whose value is reduced with rise in temperature) and the second temperature characteristic is of a positive gradient (a gradient whose value is increased with rise in temperature). Detailed description will be given later to how the variation gradient adjustment unit 12 adjusts the gradient to temperature of the second variation voltage.

The variation gradient adjustment unit 12 includes an amplifier 21, a first gradient voltage generation unit (first resistor R1), a second gradient voltage generation unit (second resistor R2), a PMOS transistor P1, and a gradient control unit 22. The amplifier 21, first resistor R1, second resistor R2, and PMOS transistor P1 form an inverting amplifier. The inverting input terminal of the amplifier 21 has the reference voltage Vconst inputted thereto; and the non-inverting input terminal thereof has a voltage VO generated at the node between the first resistor R1 and the second resistor R2 inputted thereto. The PMOS transistor P1 has its source coupled to a first power supply terminal (for example, power supply terminal VDD) and its drain coupled to the cathode of the diode Di through the first resistor R1 and the second resistor R2. The gate of the PMOS transistor P1 is supplied with an error voltage generated by the amplifier 21 based on the voltage difference between the reference voltage Vconst and the voltage V0. That is, this inverting amplifier uses the first variation voltage Vf as input voltage and amplifies the first variation voltage Vf with an amplification factor set according to the ratio of the first resistor R1 to the second resistor R2. Thus it generates a voltage obtained by amplifying the first variation voltage Vf at the node between the drain of the PMOS transistor P1 and the first resistor R1.

The first resistor R1 is formed by coupling multiple resistors R11 to R1m (m is an integer not less than 2) in series. The second resistor R2 is formed by coupling multiple resistors R21 to R2n (n is an integer not less than 2) in series. The first resistor R1 is provided at each point of junction between the resistors with an output tap. The second resistor R2 is provided at each point of junction between the resistors with an output tap. In the example in FIG. 1, multiple first voltages (for example, voltages V11 to V1m) are generated at the output taps of the first resistor R1. The voltages V11 to V1m are respectively voltages generated at the high potential-side terminals of the resistors R11 to R1m. The voltage V11 is a voltage obtained by amplifying the first variation voltage Vf with an amplification factor determined according to the resistance ratio of the first resistor R1 to the second resistor R2. In the example illustrated in FIG. 1, multiple second voltages (for example, voltages V21 to V2n) are generated at the output taps of the second resistor R2. The voltages V21 to V2n are respectively voltages generated at the low potential-side terminals of the resistors R21 to R2n. The voltage V2n is a voltage identical with the first variation voltage Vf. In addition, an output tap is provided also between the first resistor R1 and the second resistor R2 and the voltage V0 is generated at this output tap. That is, the voltages V12 to Vim, V0, V21 to V2n−1 have voltage values obtained by dividing the voltage difference between the first variation voltage Vf and the voltage V11 by the resistors R11 to R1m and the resistors R21 to R2n. The coefficients of variation with temperature of the voltages V12 to V1m, V0, V21 to V2n−1 differ according to a division ratio determined by the resistors R11 to R1m and the resistors R21 to R2n. Detailed description will be given later to the coefficients of variation with temperature of the voltages V11 to V1m, V0, V21 to V2n.

The gradient control unit 22 changes the coefficient of variation of the second variation voltage Vrefc based on a gradient set value. More specifically, the gradient control unit 22 changes an output tap for outputting the second variation voltage based on a gradient set value and thereby changes the coefficient of variation of the second variation voltage. The gradient control unit 22 includes switches SW11 to SW1m, SW0, SW21 to SW2n, a decoder 23, and a storage unit (for example, memory) 24.

One ends of the switches SW11 to SW1m are respectively coupled to the output taps at which the voltages V11 to Vim are generated. One end of the switch SW0 is coupled to the output tap at which the voltage V0 is generated. One ends of the switches SW21 to SW2n are respectively coupled to the output taps at which the voltages V21 to V2n are generated. The other ends of the switches SW11 to SW1m, SW0, SW21 to SW2n are coupled in common.

In the memory 24, a preset gradient set value is stored. This memory may be a nonvolatile memory such as a flash memory, may be a fuse circuit that holds a value by physical disruption of an element or the like, or may be a volatile memory such as DRAM. The decoder 23 selects any one of the switches SW11 to SW1m, SW0, SW21 to SW2n based on a gradient set value read from the memory 24. That is, the gradient control unit 22 selects one of the voltages generated at the output taps provided at the multiple points of junction between the resistors comprising the first resistor R1 and the second resistor R2 and outputs it as second variation voltage.

The current generation unit 13 includes an error amplifier 25, PMOS transistors P2, P3, and the current setting resistor Ri. The current generation unit 13 generates an output current Iout based on the second variation voltage Vrefc and the current setting resistor Ri.

With respect to the current setting resistor Ri, for example, its resistance value has a positive temperature characteristic to temperature. The PMOS transistor P2 has its source coupled to a power supply terminal and its drain coupled to a ground terminal through the current setting resistor Ri. The error amplifier 25 supplies an error voltage to the gate of the PMOS transistor P2 based on the voltage difference between a current setting voltage generated at the node between the PMOS transistor P2 and the current setting resistor Ri and the second variation voltage Vrefc. Then the PMOS transistor P2 outputs a current to the current setting resistor so that the voltage generated across the current setting resistor Ri based on the error voltage becomes equal to the second variation voltage Vrefc. In the current generation unit 13, the current setting voltage generated at the node between the drain of the PMOS transistor P2 and the current setting resistor Ri take the same voltage value as the second variation voltage Vrefc by virtual short-circuiting of the error amplifier 25.

The PMOS transistor P3 is coupled with the PMOS transistor P2 in a current mirror configuration. The PMOS transistor P3 outputs as output current a current in proportion to a current passed through the current setting resistor Ri by the PMOS transistor P2. The ratio of the current passed through the PMOS transistor P2 to the current passed through the PMOS transistor P3 is determined by the transistor size ratio of the two transistors. When the transistor size ratio is 1:1, for example, the current passed through the PMOS transistor P2 and the current passed through the PMOS transistor P3 are identical with each other. When the transistor size ratio is 1:2, the current passed through the PMOS transistor P3 is twice the current passed through the PMOS transistor P2. When the PMOS transistors P2, P3 are identical in gate length, their transistor size ratio is determined by the ratio of gate widths. When PNP transistors are used in place of the PMOS transistors P2, P3, the transistor size is determined by the area ratio of the emitters of the PNP transistors.

Figure 2:
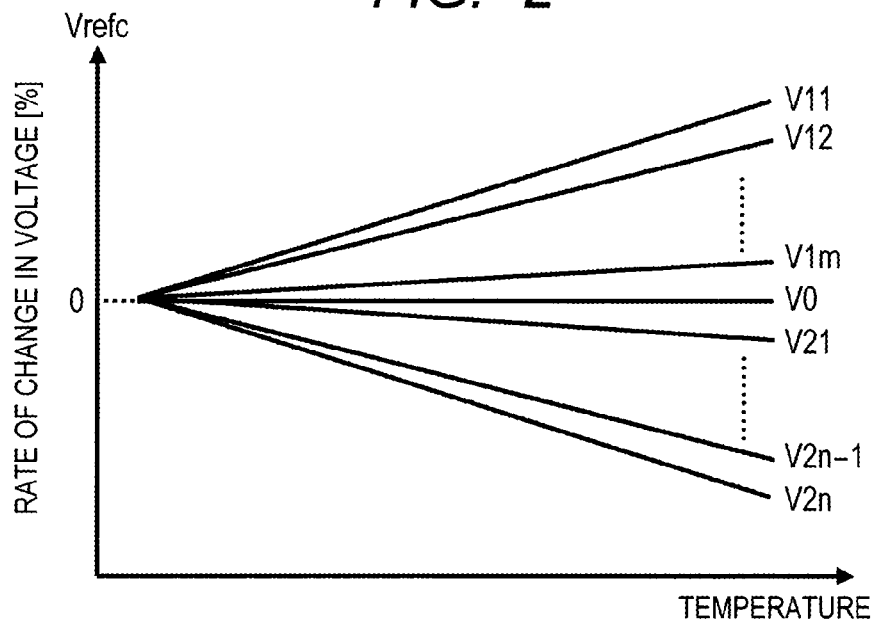
FIG. 2 is a graph indicating differences in temperature variation in a second variation voltage due to different output taps of the variation gradient adjustment unit of a constant current generation circuit in the first embodiment.

Description will be given to the operation of the constant current generation circuit 1 in the first embodiment. FIG. 2 is a graph indicating differences in temperature variation in the second variation voltage Vrefc due to different output taps of the variation gradient adjustment unit 12 of the constant current generation circuit 1. In the example illustrated in FIG. 2, the resistance values of the first resistor R1 and the second resistor R2 are set to an identical resistance value. The number of resistors comprising the first resistor R1 and the number of resistors comprising the second resistor R2 are set to an identical number and the resistance values of the resistors R11 to R1m, R21 to R2n are all made identical. In this case, as indicated in FIG. 2, the voltages V11 to V1m, V0, V21 to V2n are different in gradient to temperature variation according to the ratio of the resistor on the upper side of the node at which the relevant output tap is provided and the resistor therebelow. With respect to the voltages V11 to V1m generated at the resistor R1, the gradients of the temperature characteristic are all positive; and with respect to the voltages V21 to V2n generated at the resistor R2, the gradients of the temperature characteristic are all negative. The reason for this difference in gradient is as described below., The output taps are provided at the multiple points of junction between the resistors comprising the first resistor R1 and the second resistor R2 that determine the amplification factor of the inverting amplifier. As a result, the coefficient of variation with temperature variation of the first variation voltage is amplified by the ratio of the resistors provided above and below each output tap.

Figure 3:
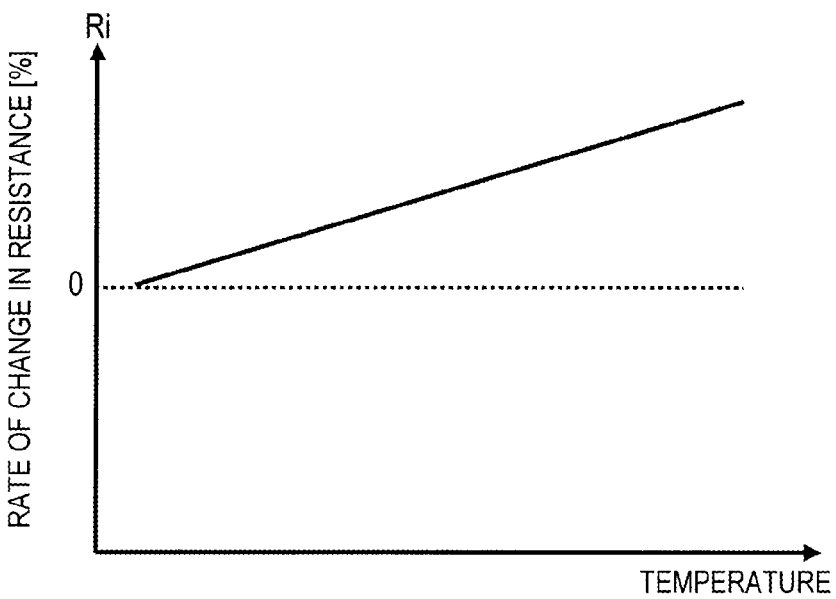
FIG. 3 is a graph indicating temperature variation in the current setting resistor of the current generation unit of a constant current generation circuit in the first embodiment.

FIG. 3 is a graph indicating temperature variation in the current setting resistor Ri of the current generation unit 13 of a constant current generation circuit 1 in the first embodiment. As indicated in FIG. 3, the current setting resistor Ri has a positive temperature characteristic and its resistance value is increased as the temperature rises.

The constant current generation circuit 1 in the first embodiment selects any one of the voltages shown in FIG. 2 at the variation gradient adjustment unit 12 and outputs it as second variation voltage Vrefc. This second variation voltage can be considered as a voltage obtained by adjusting the rate of change with temperature variation of the first variation voltage. In the constant current generation circuit 1 in the first embodiment, the voltage of an output tap to be outputted as second variation voltage Vrefc is selected based on a gradient set value stored in the memory 24. Then the constant current generation circuit 1 selects a voltage with the same coefficient of variation with temperature variation as that of the current setting resistor Ri as second variation voltage Vrefc according to the gradient set value. Thus the current value of the output current Iout becomes constant regardless of temperature variation.

Description will be given to the principle by which the output current Iout becomes constant. The output current Iout obtained when the transistor size ratio of the PMOS transistors P2, P3 is 1:1 can be expressed by Expression (1). In Expression (1), the current value of an output current is represented by Iout; the voltage value of the second variation voltage is represented by Vrefc; the resistance value of the current setting resistor is represented by Ri; the rate of change with temperature variation of the second variation voltage is represented by x; and the coefficient of variation with temperature variation of the current setting resistor is represented by y.

$$Iout=(Vrefc*x)/(Ri*y) \quad (1)$$

When it is set that x=y, Expression (1) can be transformed into Expression (2).

$$Iout=Vrefc/Ri \quad (2)$$

The following is understood from Expression (1) and Expression (2): when the coefficient of variation with temperature variation of the second variation voltage Vrefc and that of the current setting resistor Ri are identical with each other, the current value of the output current Iout is not influenced by temperature variation.

Figure 4:
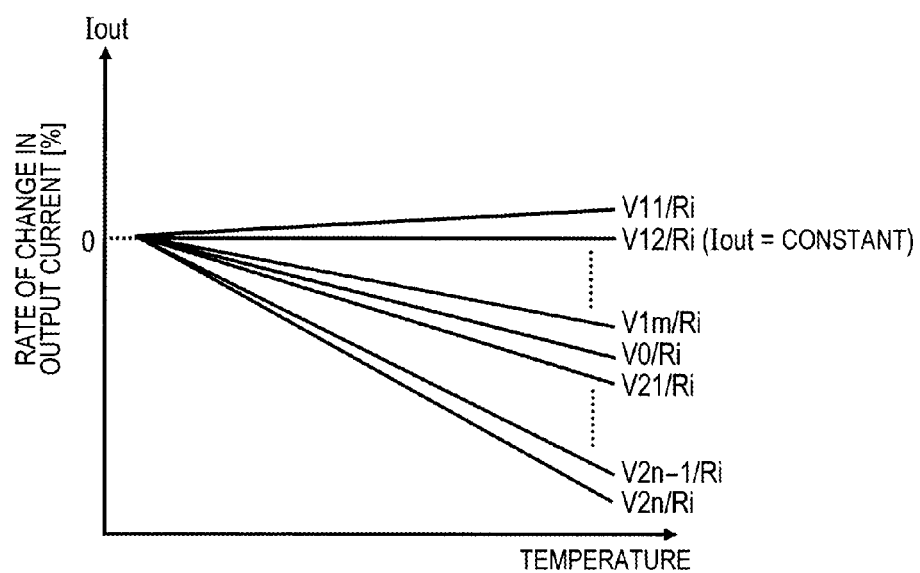
FIG. 4 is a graph indicating differences in temperature variation in an output current due to different voltage output points for a second variation voltage in the variation gradient adjustment unit of a constant current generation circuit in the first embodiment.

FIG. 4 is a graph indicating differences in temperature variation in the output current due to different output taps for taking out the second variation voltage in the variation gradient adjustment unit of a constant current generation circuit in the first embodiment. In the example shown in FIG. 4, it is understood that the output current Iout becomes constant regardless of temperature variation by taking the second variation voltage Vrefc out of the output tap from which the voltage V12 is outputted. This is because the coefficient of variation with temperature variation of the voltage V12 shown in FIG. 2 and the coefficient of variation with temperature variation of the current setting resistor Ri are identical with each other.

Description will be given to a setting method for the output current Iout in a constant current generation circuit 1 in the first embodiment. It is understood from Expression (2) that in the constant current generation circuit 1, the current value of the output current Iout can be set by changing the value of the current setting resistor Ri. The voltages V11 to V1m, V0, V21 to V2n of the output taps from which the second variation voltage Vrefc is taken out respectively have different voltage values. For this reason, the current value of the output current Iout may get out of a preset stipulated range depending on the voltage selected as second variation voltage. In such a case, the current value of the output current Iout can be set within the stipulated range by trimming the resistance value of the current setting resistor Ri or carrying out any other like processing.

The following resistors can be used for the current setting resistor Ri: a polysilicon resistor (positive temperature characteristic), an N-well resistor (negative temperature characteristic), or a tungsten resistor (positive temperature characteristic) formed over a semiconductor substrate or a resistor provided as an external component. However, in consideration of the reduction of the number of terminals of a semiconductor device and the stabilization of output current, it is desirable to use a tungsten resistor formed over a semiconductor substrate as the current setting resistor Ri.

Figure 5:
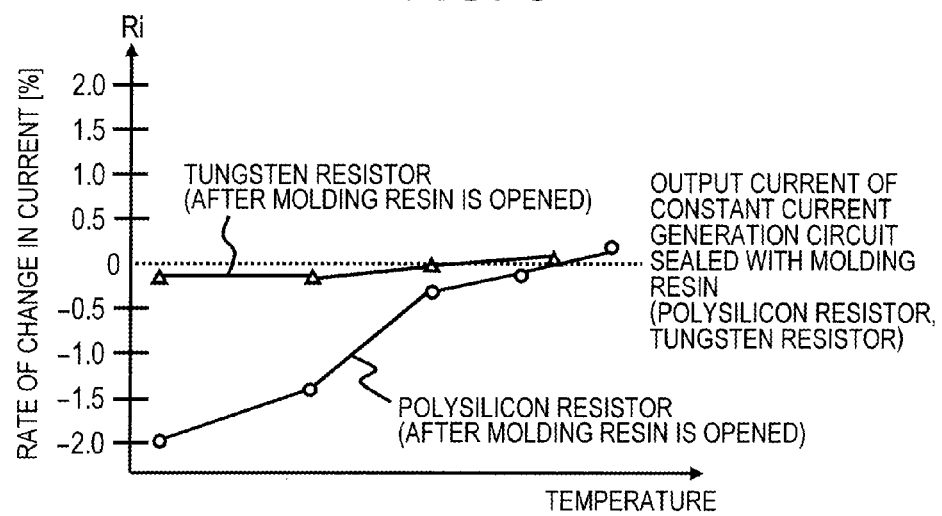
FIG. 5 is a graph indicating differences in temperature variation in an output current according to the presence or absence of a sealing material for a semiconductor chip in which a constant current generation circuit in the first embodiment is formed.

This is because the resistance value of the tungsten resistor is stable even when stress on a semiconductor substrate changes. FIG. 5 indicates differences in temperature variation in an output current caused by the presence or absence of a sealing material (for example, molding resin) on a semiconductor chip in which a constant current generation circuit in the first embodiment is formed. In the example shown in FIG. 5, the following rates of change are indicated: the rate of change in output current depending on the presence or absence of molding resin observed when a tungsten resistor is used for the current setting resistor Ri; and the rate of change in output current depending on the presence or absence of molding resin observed when a polysilicon resistor is used for the current setting resistor Ri. In the case of the tungsten resistor, as indicated in FIG. 5, the error between output current obtained without molding resin and output current obtained with molding resin is less than 0.5%. In the case of the polysilicon resistor, meanwhile, the error between output current obtained without molding resin and output current obtained with molding resin is 2% or so at the maximum. A semiconductor device is formed by sealing a semiconductor chip with molding resin and this molding resin gives stress to the semiconductor chip. That is, it is understood from FIG. 5 that a tungsten resistor can maintain more stable characteristics against stress on a semiconductor chip than a polysilicon resistor. Stress on a semiconductor chip is varied by change in the temperature of molding resin, warp in a mounting board caused when it is mounted, or the like. Therefore, to obtain more stable output current Iout, it is desirable to use a tungsten resistor for the current setting resistor Ri.

Figure 6:
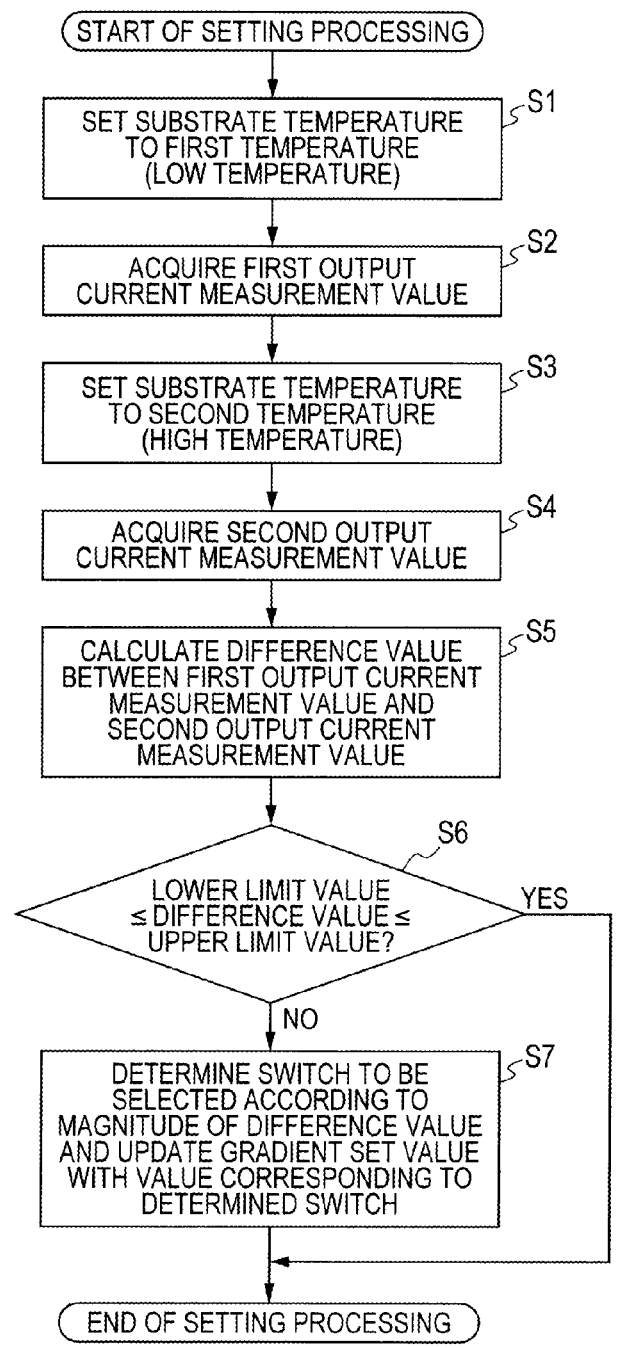
FIG. 6 is a flowchart illustrating a setting procedure for a set value in a constant current generation circuit in the first embodiment.

Description will be given to a setting method for a gradient set value in a constant current generation circuit 1 in the first embodiment. In the constant current generation circuit 1, in general, a gradient set value is determined and stored in the memory 24 before use is started. However, a stored gradient set value must be determined in a shipment test conducted prior to shipment. FIG. 6 is a flowchart illustrating a setting procedure for a gradient set value in a shipment test. It will be assumed that before the setting procedure illustrated in FIG. 6 is carried out, the gradient set value is set to an initial value set without exception regardless of temperature variation in the output current Iout.

First, in the setting procedure, as illustrated in FIG. 6, the temperature of a semiconductor substrate in which the constant current generation circuit 1 is formed is set to a first temperature (Step S1). The first temperature is a temperature lower than the second temperature described later. Then the current value (first output current measurement value) of the output current Iout of the constant current generation circuit 1 formed over the semiconductor substrate set to the first temperature is acquired (Step S2).

Subsequently, the temperature of the semiconductor substrate is set to a second temperature (Step S3). The second temperature is a temperature higher than the first temperature. The current value (second output current measurement value) of the output current Iout of the constant current generation circuit 1 formed over the semiconductor substrate set to the second temperature is acquired (Step S4).

Subsequently, the difference value between the first output current measurement value and the second output current measurement value is calculated (Step S5). This calculation is carried out with a testing device or the like for testing the semiconductor device including the constant current generation circuit 1. Subsequently, it is determined whether or not the difference value calculated at Step S5 is within a preset stipulated range (Step S6). Ideally, it is desirable that the coefficient of variation with temperature variation of the output current Iout should be zero. However, since the voltages V11 to V1m, V0, V21 to V2n generated at the variation gradient adjustment unit 12 take discrete voltage values, it is not realistic to zero the coefficient of variation with temperature variation of the output current Iout. At Step S6, consequently, a stipulated range is stipulated by an upper limit value and a lower limit value and when the difference value is within the stipulated range, it is considered that the requirements are met.

When it is determined at Step S6 that the difference value is out of the stipulated range, the processing of Step S7 is carried out. At Step S7, a switch to be selected by the decoder is determined according to the magnitude of the difference value and the gradient set value is updated with a value corresponding to the determined switch. For example, when the difference value is lower than the lower limit value, the gradient set value is updated with the following value: such a value that a switch corresponding to an output tap at which a higher voltage than the present value is generated according to the amount of deviation of the difference value from the lower limit value. When it is determined at Step S6 that the difference value is within the stipulated range, the series of processing is terminated.

As described above, in the constant current generation circuit 1 in the first embodiment, the variation gradient adjustment unit 12 generates the following second variation voltage from the first variation voltage Vf having a predetermined coefficient of variation with temperature variation: the second variation voltage Vrefc having such a coefficient of variation as to agree with the coefficient of variation with temperature variation of the resistance value of the current setting resistor Ri. At the variation gradient adjustment unit 12, at this time, the coefficient of variation with temperature variation of the second variation voltage Vrefc is adjusted by only changing an output tap at which an voltage outputted as second variation voltage is generated. That is, at the constant current generation circuit 1, the coefficient of variation with temperature variation of the second variation voltage Vrefc can be adjusted by only one parameter so that the output current becomes constant regardless of the temperature.

In the technology described in Patent Document 1, the current IRAMP is generated by the resistance value of the resistor R obtained by combining two resistors whose resistance values oppositely fluctuate with temperature. As indicated in FIG. 3 of Patent Document 1, however, the coefficient of variation with temperature variation of the resistance value of the resistor R is 2% or so. That is, in the technology described in Patent Document 1, variation with temperature in the current IRAMP is 2% or so. Meanwhile, the constant current generation circuit 1 in the first embodiment is capable of confining the coefficient of variation of the output current Iout to 1% or below by taking the following measure: the coefficient of variation with temperature variation of the resistance value of the current setting resistor Ri and the coefficient of variation with temperature variation of the second variation voltage Vrefc are matched with each other.

In the constant current generation circuit 1 in the first embodiment, the following measure can be taken when the current value of the output current Iout deviates from a stipulated range: it can be corrected by changing the resistance value of the current setting resistor Ri by trimming or the like. Even when the resistance value of the current setting resistor Ri is changed, this change does not have influence on the voltage value or coefficient of variation of the second variation voltage Vrefc. That is, in the constant current generation circuit 1, the current value of the output current Iout can be adjusted independently of the coefficient of variation with temperature variation of the output current Iout. In the constant current generation circuit 1, as a result, it is possible to accurately set the current value and coefficient of variation with temperature variation of the output current Iout.

In the technology described in Patent Document 1, it is difficult to form both of two resistors of metal resistors in the following cases: cases where the two resistors having opposite temperature characteristics to each other to set the current value of the output current Iout by the combined resistance of the two resistors. That is, in the technologies described in Patent Document 1 and the like, it is difficult to reduce variation in output current Iout against stress applied to the semiconductor chip. Meanwhile, in the constant current generation circuit 1 in the first embodiment, the following can be implemented by using such a metal resistor as a tungsten resistor for the current setting resistor Ri: it is possible to generate the output current Iout that does not vary so much even against stress applied to the semiconductor chip in which the constant current generation circuit 1 is formed.

In the constant current generation circuit 1 in the first embodiment, both the resistors R1, R2 are provided with output taps so that the following can be implemented: the temperature characteristic of the second variation voltage Vrefc may be a positive temperature characteristic or may be a negative temperature characteristic. When the temperature characteristic of the second variation voltage Vrefc may be either of the temperature characteristics, output taps only have to be provided in either of the resistors R1, R2.

Second Embodiment

Figure 7:
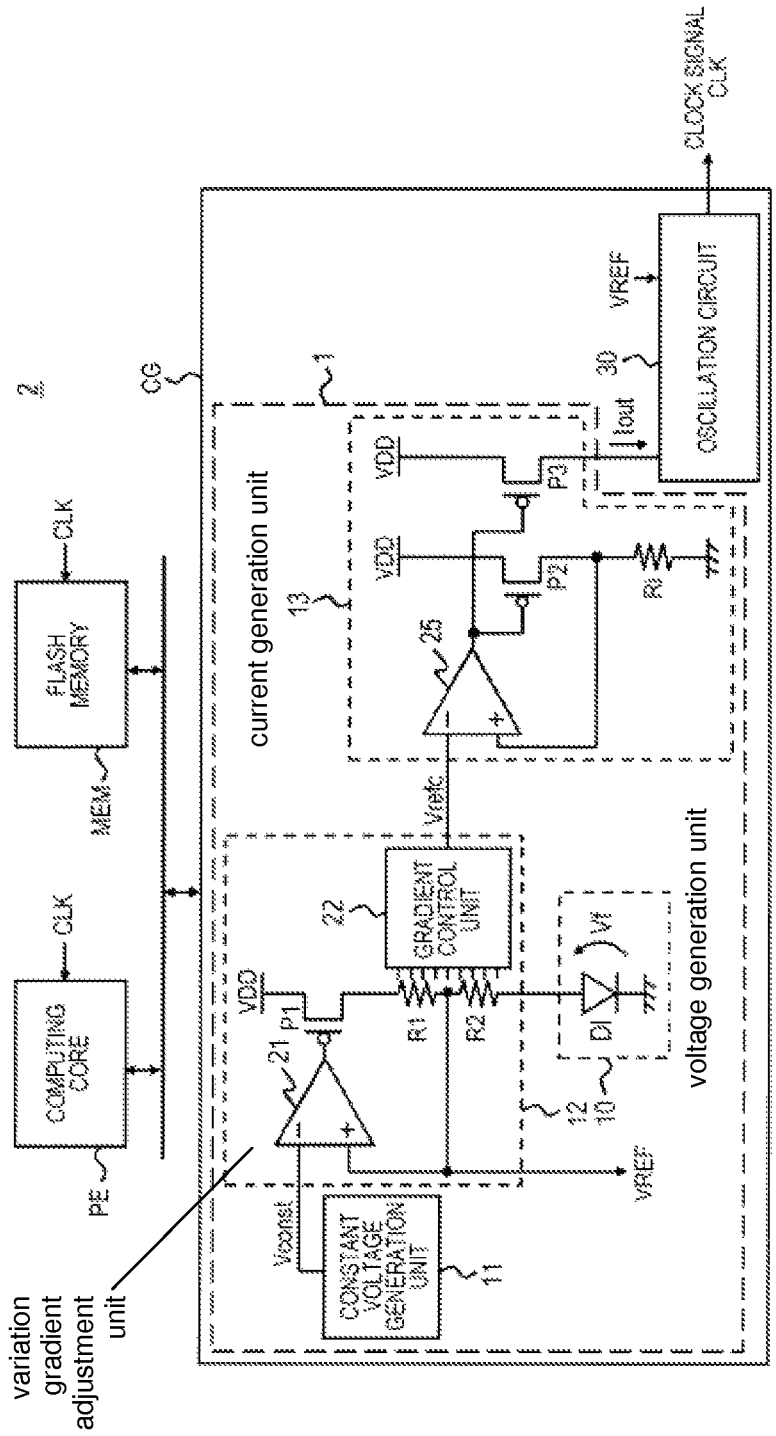
FIG. 7 is a block diagram of a microprocessor in a second embodiment.

FIG. 7 is a block diagram of a microprocessor 2 in the second embodiment. As illustrated in FIG. 7, the microprocessor 2 includes a computing core PE, a memory (for example, flash memory MEM), and a clock generation circuit CG. The clock generation circuit CG includes a constant current generation circuit 1 in the first embodiment. The clock generation circuit CG utilizes the highly accurate output current Iout generated at the constant current generation circuit 1 to generate a clock signal CLK that does not fluctuate so much with temperature. In the example illustrated in FIG. 2, the clock signal CLK outputted by the clock generation circuit CG is supplied to the computing core PE and the flash memory MEM. However, this clock signal CLK may be outputted to an external source.

Detailed description will be given to a microprocessor 2 in the second embodiment. The constant current generation circuit 1 in the following description is substantially the same as that described in relation to the first embodiment; therefore, the detailed description thereof will be omitted here.

In the flash memory MEM, a program and a set value are stored. The computing core PE carries out computation processing based on the program stored in the flash memory. The clock generation circuit CG generates an output signal (clock signal CLK) whose oscillating frequency is determined based on the output current Iout generated by the constant current generation circuit 1. The flash memory MEM, computing core PE, and clock generation circuit CG are coupled with one another through an internal bus.

Figure 8:
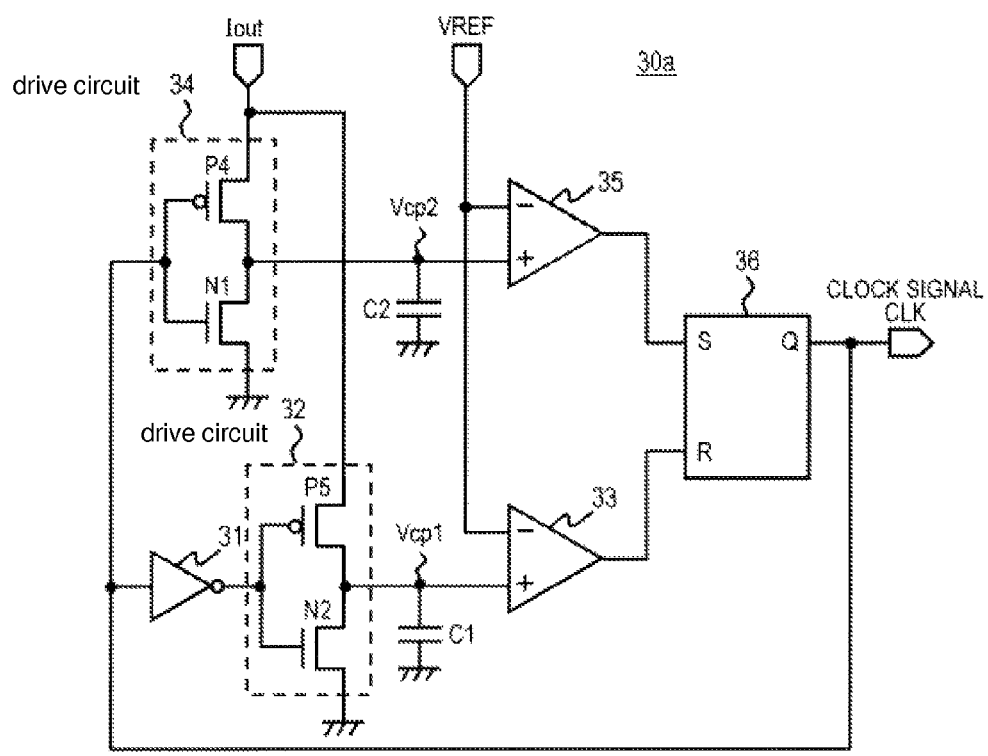
FIG. 8 is a block diagram illustrating an example of an oscillation circuit in the second embodiment.

Detailed description will be given to an oscillation circuit 30. FIG. 8 is a block diagram of an oscillation circuit 30a as an example of the oscillation circuit 30. The oscillation circuit 30a includes an inverter 31, capacitive drive circuits 32, 34, comparators 33, 35, an SR latch circuit 36, and capacitors C1, C2.

The capacitive drive circuit 32 includes an NMOS transistor N2 and a PMOS transistor P5. The source of the NMOS transistor N2 is coupled to a ground terminal and the drain thereof is coupled to the drain of the PMOS transistor P5. The point of junction between the drain of the PMOS transistor P5 and the drain of the NMOS transistor N2 is the output node of the capacitive drive circuit 32. The output current Iout outputted by the constant current generation circuit 1 is inputted to the source of the PMOS transistor P5. The gate of the PMOS transistor P5 and the gate of the NMOS transistor N2 are coupled in common and the clock signal CLK outputted by the oscillation circuit 30a is inputted thereto through the inverter 31. The inverter 31 outputs a signal obtained by inverting the clock signal CLK to the capacitive drive circuit 32.

The capacitor C1 is coupled between the output node of the capacitive drive circuit 32 and a ground terminal. At the output node, a voltage Vcp1 is generated according to the amount of electric charges accumulated in the capacitor C1.

The comparator 33 has the voltage Vcp1 inputted to its non-inverting input terminal and has an oscillation reference voltage VREF inputted to its inverting input terminal. The comparator 33 switches the logical level of a reset signal R according to the magnitude relation between the voltage Vcp1 and the oscillation reference voltage VREF. More specific description will be given. When the voltage Vcp1 is higher than the voltage VREF, the comparator 33 brings the reset signal R to the low level. When the voltage Vcp1 is lower than the oscillation reference voltage VREF, meanwhile, the comparator 33 brings the reset signal R to the high level. To stably switch the logical level of the outputted reset signal R, it is desirable that the comparator 33 should be a hysteresis comparator. Letting the hysteresis width be dh, the hysteresis comparator switches the logical level as follows: when the voltage Vcp1>the oscillation reference voltage VREF, it switches the reset signal R from the low level to the high level; and when the voltage Vcp1+dh<the oscillation reference voltage VREF, it switches the reset signal R from the high level to the low level.

The capacitive drive circuit 34 includes an NMOS transistor N1 and a PMOS transistor P4. The source of the NMOS transistor N1 is coupled to a ground terminal and the drain thereof is coupled with the drain of the PMOS transistor P4. The point of junction between the drain of the PMOS transistor P4 and the drain of the NMOS transistor N1 is the output node of the capacitive drive circuit 34. The output current Iout outputted by the constant current generation circuit 1 is inputted to the source of the PMOS transistor P4. The gate of the PMOS transistor P4 and the gate of the NMOS transistor N1 are coupled in common and the clock signal CLK outputted by the oscillation circuit 30a is inputted thereto.

The capacitor C2 is coupled between the output node of the capacitive drive circuit 34 and a ground terminal. At the output node, a voltage Vcp2 is generated according to the amount of electric charges accumulated in the capacitor C2.

The comparator 35 has the voltage Vcp2 inputted to its non-inverting input terminal and the oscillation reference voltage VREF inputted to its inverting input terminal. The comparator 35 switches the logical level of a set signal S according to the magnitude relation between the voltage Vcp2 and the oscillation reference voltage VREF. More specific description will be given. When the voltage Vcp2 is higher than the oscillation reference voltage VREF, the comparator 35 brings the set signal S to the low level. When the voltage Vcp2 is lower than the oscillation reference voltage VREF, the comparator 35 brings the set signal S to the high level. To stably switch the logical level of the outputted set signal S, it is desirable that the comparator 35 should be a hysteresis comparator. Letting the hysteresis width be dh, the hysteresis comparator switches the logical level as follows: when the voltage Vcp2>the oscillation reference voltage VREF, it switches the set signal S from the low level to the high level; and when the voltage Vcp1+dh<the oscillation reference voltage VREF, it switches the set signal S from the high level to the low level.

The SR latch circuit 36 has the set signal S and the reset signal R inputted thereto and outputs an output signal Q. This output signal Q provides the clock signal CLK. The SR latch circuit 36 causes the clock signal CLK to rise in response to a rising edge of the set signal S and causes the clock signal CLK to fall in response to a falling edge of the reset signal R.

The oscillation circuit 30a has the oscillation reference voltage VREF inputted thereto. The voltage at the non-inverting input terminal of the amplifier 21 of the constant current generation circuit 1 is used for this oscillation reference voltage VREF. The voltage at the non-inverting input terminal of the amplifier 21 is substantially identical with the reference voltage Vconst. However, when the amplifier 21 has an input offset, a voltage difference is produced between the reference voltage Vconst and the voltage at the non-inverting input terminal of the amplifier 21. The voltage at the non-inverting input terminal of the amplifier 21 is a voltage on which the second variation voltage is based. That is, the voltage at the non-inverting input terminal of the amplifier 21 has higher correlation between it and the output current Iout of the constant current generation circuit 1 than between it and the reference voltage Vconst. The oscillating frequency of the oscillation circuit 30a is determined according to the amount of the output current Iout of the constant current generation circuit 1. Because of the foregoing, the oscillation circuit 30a can reduce an error of the oscillating frequency from an expected value by operating the oscillation circuit 30a based on the oscillation reference voltage VREF.

Figure 9:
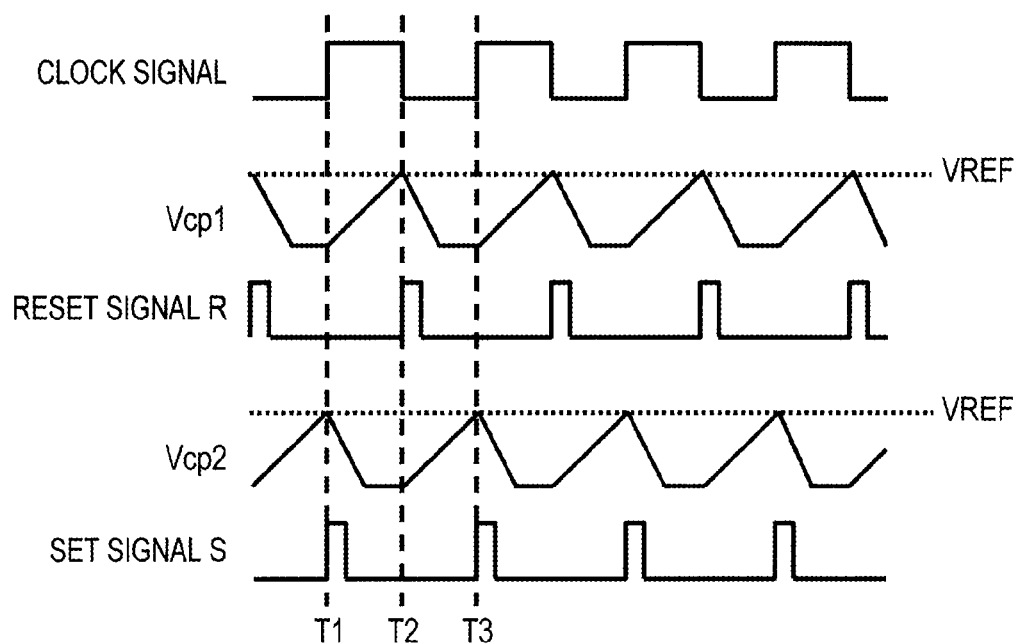
FIG. 9 is a timing chart indicating the operation of the oscillation circuit illustrated in FIG. 8.

FIG. 9 is a timing chart indicating the operation of the oscillation circuit 30a. First, description will be given to the operation of the oscillation circuit 30a performed during a period for which the clock signal CLK at the low level. During a period for which the clock signal CLK is at the low level, in the capacitive drive circuit 32, the PMOS transistor P5 is turned off and the NMOS transistor N2 is turned on. Then the capacitive drive circuit 32 extracts electric charges from the capacitor C1 by the NMOS transistor N2 and lower the voltage level of the voltage Vcp1. When the voltage level of the voltage Vcp1 is thereafter lowered from the oscillation reference voltage VREF and becomes lower than a predetermined voltage (for example, VREF-hysteresis width), the comparator 33 switches the reset signal R from the high level to the low level.

During a period for which the clock signal CLK is at the low level, in the capacitive drive circuit 34, the PMOS transistor P4 is turned on and the NMOS transistor N1 is turned off. Then the capacitive drive circuit 34 supplies the output current Iout to the capacitor C2 through the PMOS transistor P4 to increase the amount of electric charges accumulated in the capacitor C2. It thereby increases the voltage level of the voltage Vcp2. When the voltage level of the voltage Vcp2 thereafter reaches the oscillation reference voltage VREF, the comparator 35 switches the set signal S from the low level to the high level (times T1, T3).

Description will be given to the operation of the oscillation circuit 30a performed during a period for which the clock signal CLK at the high level. During a period for which the clock signal CLK is at the high level, in the capacitive drive circuit 32, the PMOS transistor P5 is turned on and the NMOS transistor N2 is turned off. The capacitive drive circuit 32 supplies the output current Iout to the capacitor C1 through the PMOS transistor P5 to increase the amount of electric charges accumulated in the capacitor C1. It thereby increases the voltage level of the voltage Vcp1. When the voltage level of the voltage Vcp1 thereafter reaches the oscillation reference voltage VREF, the comparator 33 switches the reset signal R from the low level to the high level (time T2).

During a period for which the clock signal CLK is at the high level, in the capacitive drive circuit 34, the PMOS transistor P4 is turned off and the NMOS transistor N1 is turned on. Then the capacitive drive circuit 34 extracts electric charges from the capacitor C2 by the NMOS transistor N1 and lower the voltage level of the voltage Vcp2. When the voltage level of the voltage Vcp2 is thereafter lowered from the oscillation reference voltage VREF and becomes lower than a predetermined voltage (for example, VREF-hysteresis width), the comparator 35 switches the set signal S from the high level to the low level.

The SR latch circuit 36 switches the clock signal between the high level and the low level in response to a rising edge of the set signal S and a rising edge of the reset signal R.

In the oscillation circuit 30a, the speed (dV/dt) of rise in the voltages Vcp1, Vcp2 can be expressed as a function of the output current Iout. This function is shown as Expression (3). In Expression (3), C is the capacitance value of the capacitors C1, C2.

$$dV/dt = Iout/C \quad (3)$$

In the oscillation circuit 30a, the oscillating frequency is determined by the time it takes for the voltages Vcp1, Vcp2 to reach the oscillation reference voltage VREF from the ground voltage level. According to Expression (3), when the capacitance value of the capacitors C1, C2 is constant, the rising speed of the voltages Vcp1, Vcp2 is determined by the magnitude of the output current Iout. That is, the frequency of the clock signal outputted by the oscillation circuit 30a is determined by the current value of the output current Iout.

With respect to the output current Iout generated by the constant current generation circuit 1 in the first embodiment, the coefficient of variation with temperature variation can be set to zero. That is, the oscillation circuit 30a in FIG. 8 whose oscillating frequency is determined based on the output current Iout outputted by the constant current generation circuit 1 makes it possible to achieve high frequency accuracy (for example, variation width of less than 1%).

Figure 10:
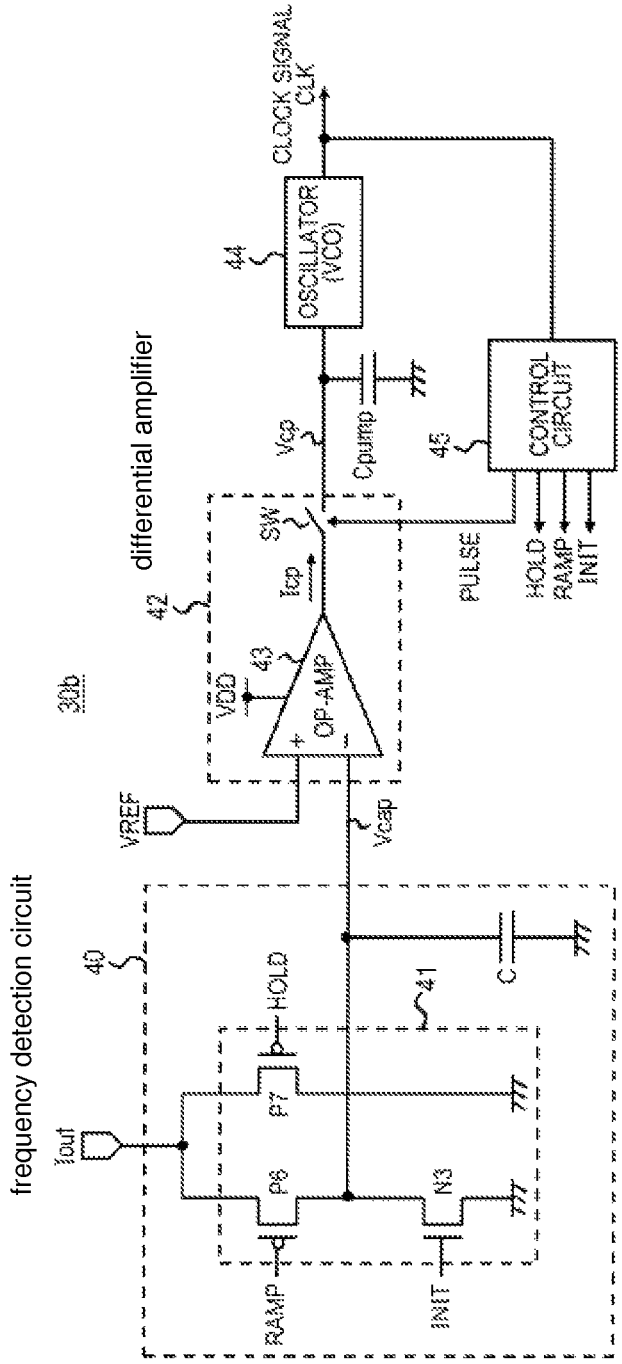
FIG. 10 is a block diagram illustrating another example of an oscillation circuit in the second embodiment.

Description will be given to another example of the oscillation circuit 30. FIG. 10 is a block diagram illustrating an oscillation circuit 30b as another example of the oscillation circuit 30. As illustrated in FIG. 10, the oscillation circuit 30b includes a frequency detection circuit 40, a differential amplifier 42, an oscillator 44 (for example, voltage controlled oscillator), a control circuit 45, and a filter capacitor Cpump.

The frequency detection circuit 40 generates a frequency detection voltage Vcap whose voltage level varies according to the length of the period of the clock signal CLK based on a timing control signal outputted by the control circuit 45. The timing control signal includes a charge reset signal INIT, a ramp control signal RAMP, and a hold control signal HOLD. The frequency detection circuit 40 generates the frequency detection voltage Vcap according to these signals.

As illustrated in FIG. 10, the frequency detection circuit 40 includes a ramp and hold circuit 41 and a frequency setting capacitor C. To the ramp and hold circuit 41, the output current Iout is inputted from the constant current generation circuit 1. That is, at the ramp and hold circuit 41, the current value of charging/discharging current is set by the output current Iout.

The ramp and hold circuit 41 supplies a charging/discharging current to the frequency setting capacitor C and resets the electric charges accumulated in the frequency setting capacitor C based on the timing control signal. The ramp and hold circuit 41 includes an NMOS transistor N3 and PMOS transistors P6, P7. The PMOS transistors P6, P7 form a differential pair. That is, the PMOS transistors P6, P7 have their sources coupled in common. The source (common junction point) of the PMOS transistors P6, P7 is supplied with the output current Iout. The ramp control signal RAMP is inputted to the gate of the PMOS transistor P6 and the hold control signal HOLD is inputted to the gate of the PMOS transistor P7. The drain of the PMOS transistor P6 is coupled with the drain of the NMOS transistor N3 and provides an output terminal of the ramp and hold circuit 41. The drain of the PMOS transistor P7 is coupled to a ground terminal. The charge reset signal INIT is inputted to the gate of the NMOS transistor N3. The source of the NMOS transistor N3 is coupled to a ground terminal.

The frequency setting capacitor C is coupled between the output terminal of the ramp and hold circuit 41 and a ground terminal. The frequency setting capacitor C generates a frequency detection voltage Vcap according to the amount of electric charges accumulated therein. The frequency detection voltage Vcap is generated at the node that is the output terminal of the ramp and hold circuit 41.

When the charge reset signal INIT is brought into an enable state (for example, high level), the ramp and hold circuit 41 turns on the NMOS transistor N3. The ramp and hold circuit 41 discharges electric charges accumulated in the frequency setting capacitor C and thereby resets the electric charges accumulated in the frequency setting capacitor. When the charge reset signal INIT is brought into a disenable state (for example, low level) and the ramp control signal RAMP is brought into an enable state (for example, low level), the ramp and hold circuit 41 carries out the following processing: it turns off the NMOS transistor N3 and on the PMOS transistor P6. As a result, the ramp and hold circuit 41 accumulates electric charges in the frequency setting capacitor C by a charging/discharging current. When the ramp control signal RAMP is brought into a disenable state (for example, high level) and the hold control signal HOLD is brought into an enable state (for example, low level), the ramp and hold circuit 41 carries out the following processing: it turns off the PMOS transistor P6 and on the PMOS transistor P7. As a result, the ramp and hold circuit 41 stops charging of the frequency setting capacitor C and maintains the frequency detection voltage Vcap produced by the electric charges accumulated in the frequency setting capacitor C.

The differential amplifier 42 continuously varies an oscillating frequency setting current Icp according to the voltage difference between the frequency detection voltage Vcap and the oscillation reference voltage VREF and outputs it to the filter capacitor Cpump. More specific description will be given. The differential amplifier 42 includes an amplification unit 43 and a switch circuit SW. The frequency detection voltage Vcap is inputted to the inverting input terminal of the amplification unit 43 and the oscillation reference voltage VREF is inputted to the non-inverting input terminal thereof. The amplification unit 43 is, for example, a transconductance amplifier and outputs the oscillating frequency setting current Icp having a current value corresponding to the voltage difference between the frequency detection voltage Vcap and the oscillation reference voltage VREF.

In this embodiment, the voltage at the non-inverting input terminal of the amplifier 21 in the constant current generation circuit 1 is used for the oscillation reference voltage VREF. The voltage at the non-inverting input terminal of the amplifier 21 is substantially identical with the reference voltage Vconst. However, when the amplifier 21 has an input offset, a voltage difference is produced between the reference voltage Vconst and the voltage at the non-inverting input terminal of the amplifier 21. The voltage at the non-inverting input terminal of the amplifier 21 is a voltage on which the second variation voltage is based. That is, the voltage at the non-inverting input terminal of the amplifier 21 has higher correlation between it and the output current Iout of the constant current generation circuit 1 than between it and the reference voltage Vconst. The oscillating frequency of the oscillation circuit 30b is determined according to the amount of the output current Iout of the constant current generation circuit 1. Because of the foregoing, the oscillation circuit 30b can reduce an error of the oscillating frequency from an expected value by operating the oscillation circuit 30b based on the oscillation reference voltage VREF.

The switch circuit SW is provided between the output terminal of the amplification unit 43 and the filter capacitor Cpump and its state of conduction is switched according to a pump control signal PULSE included in the timing control signal. More specifically, the switch circuit SW is brought into conduction when the pump control signal PULSE is in an enable state (for example, high level) and out of conduction when the signal is in a disenable state (for example, low level).

The oscillator 44 controls the oscillating frequency of the clock signal CLK according to the voltage level of an oscillating frequency control voltage Vcp.

The control circuit 45 generates a timing control signal whose logical level is switched based on the period of the clock signal CLK. This timing control signal includes a charge reset signal INIT, a ramp control signal RAMP, a hold control signal HOLD, and a pump control signal PULSE. The control circuit 45 generates a frequency divided signal obtained by dividing the frequency of the clock signal CLK and switches the logical level of each of the above control signals based on a count value obtained by counting the ticking of the clock of the frequency divided signal. Detailed description will be given later to the timing of switching the logical level of the timing control signal.

Figure 11:
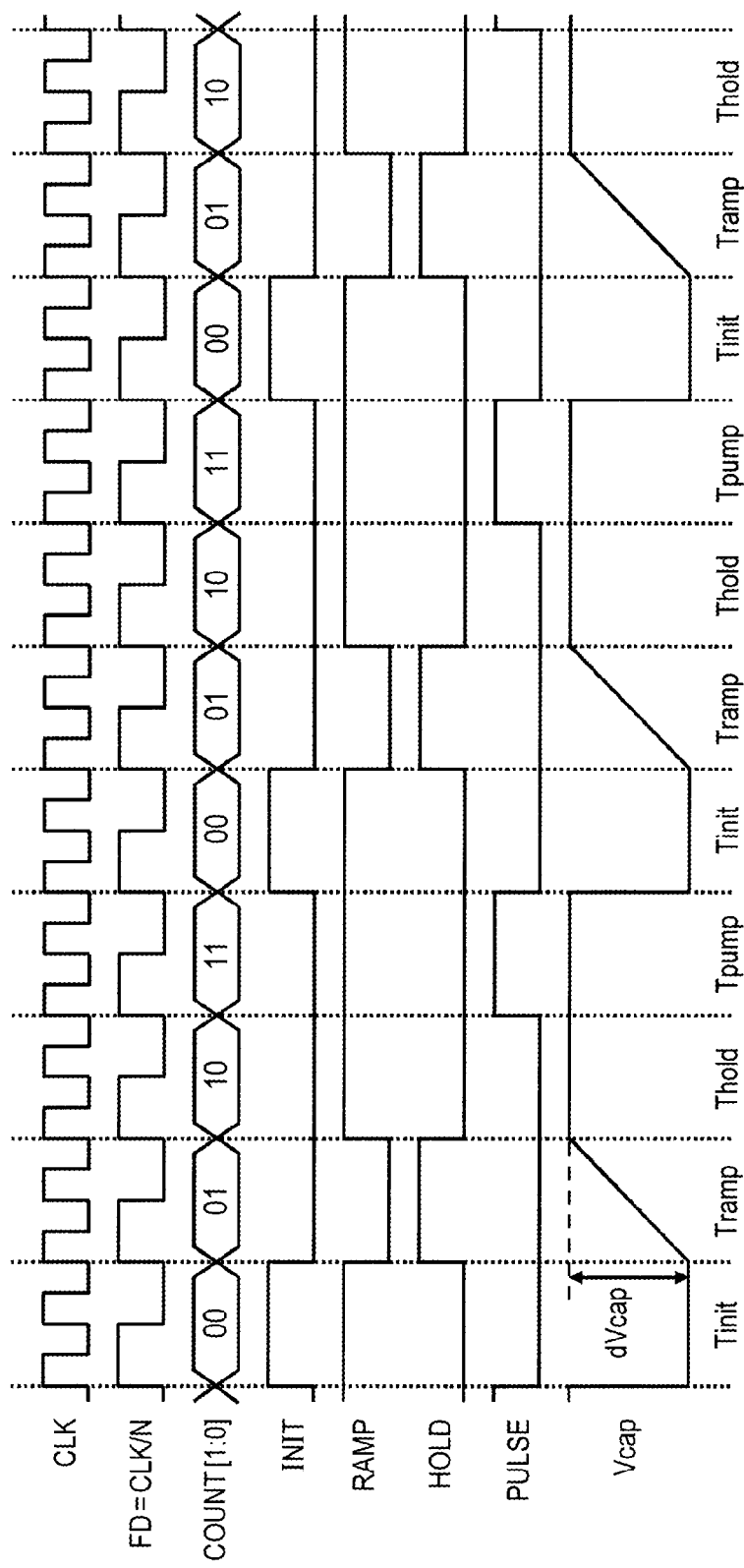
FIG. 11 is a timing chart indicating the operation of the control circuit of the oscillation circuit illustrated in FIG. 10.

FIG. 11 is a timing chart indicating the operation of the frequency detection circuit 40 and the control circuit 45. Description will be given to the timing of switching the logical level of the timing control signal generated by the control circuit 45 switches and the operation of the frequency detection circuit 40 with reference to FIG. 11.

As indicated in FIG. 11, the control circuit 45 divides the frequency of the clock signal CLK to generate the frequency divided signal FD. In the example shown in FIG. 11, the frequency divided signal FD is generated by dividing the frequency of the clock signal CLK into two. The control circuit 45 counts the ticking of the clock of the frequency divided signal FD to generate a count value COUNT. In the example shown in FIG. 11, the count value COUNT is a two-bit value and takes 0 to 3. The control circuit 45 switches the logical level of the timing control signal according to the count value COUNT.

Specific description will be given. When the count value is 0, the control circuit 45 carries out the following processing: it brings the charge reset signal INIT to the high level (enable state); it brings the ramp control signal RAMP to the high level (disenable state); it brings the hold control signal HOLD to the low level (enable state); and it brings the pump control signal PULSE to the low level (disenable state). A period during which the count value is 0 will be hereafter referred to as charge reset period Tinit.

When the count value is 1, the control circuit 45 carries out the following processing: it brings the charge reset signal INIT to the low level (disenable state); it brings the ramp control signal RAMP to the low level (enable state); it brings the hold control signal HOLD to the high level (disenable state); and it brings the pump control signal PULSE to the low level (disenable state). A period during which the count value is 1 will be hereafter referred to as ramp period Tramp.

When the count value is 2, the control circuit 45 carries out the following processing: it brings the charge reset signal INIT to the low level (disenable state); it brings the ramp control signal RAMP to the high level (disenable state); it brings the hold control signal HOLD to the low level (enable state); and it brings the pump control signal PULSE to the low level (disenable state). A period during which the count value is 2 will be hereafter referred to as hold period Thold.

When the count value is 3, the control circuit 45 carries out the following processing: it brings the charge reset signal INIT to the low level (disenable state); it brings the ramp control signal RAMP to the high level (disenable state); it brings the hold control signal HOLD to the low level (enable state); and it brings the pump control signal PULSE to the high level (enable state). A period during which the count value is 3 will be hereafter referred to as pump period Tpump.

Description will be given to the operation of the frequency detection circuit 40. The frequency detection circuit 40 brings the NMOS transistor N3 into conduction based on the charge reset signal INIT during a charge reset period Tinit. It thereby resets the electric charges accumulated in the frequency setting capacitor C to a charge amount corresponding to the ground voltage. As a result, the frequency detection voltage Vcap becomes a voltage substantially equal to the ground voltage. At this time, the PMOS transistor P6 is turned off according to the ramp control signal RAMP and the PMOS transistor P7 is turned on according to the hold control signal HOLD.

During a ramp period Tramp, the frequency detection circuit 40 carries out the following processing: it turns off the NMOS transistor N3 according to the charge reset signal INIT; it turns on the PMOS transistor P6 according to the ramp control signal RAMP; and it turns off the PMOS transistor P7 according to the hold control signal HOLD. That is, during a ramp period Tramp, the frequency detection circuit 40 charges the frequency setting capacitor C with electric charges based on a charging/discharging current. As a result, the voltage level of the frequency detection voltage Vcap is gradually increased. The gradient at which the frequency detection voltage Vcap is increased is determined by the magnitude of the charging/discharging current and the capacitance value of the frequency setting capacitor C. For example, the gradient (dVcap/dt) of the frequency detection voltage Vcap is expressed by dVcap/dt=Iout/C. During a ramp period Tramp, the voltage level of the frequency detection voltage Vcap is increased but the voltage drop speed is constant. For this reason, the voltage drop amount dVcap of the frequency detection voltage Vcap during a ramp period Tramp is determined by the length of the ramp period Tramp (the oscillating frequency of the clock signal CLK).

During a hold period Thold, the frequency detection circuit 40 carries out the following processing: it turns off the NMOS transistor N3 according to the charge reset signal INIT; it turns off the PMOS transistor P6 according to the ramp control signal RAMP; and it turns on the PMOS transistor P7 according to the hold control signal HOLD. That is, the frequency detection circuit 40 carries out the following processing during a hold period Thold: it brings the node to which the frequency setting capacitor C is coupled into a high impedance state and maintains the voltage level of the frequency detection voltage Vcap generated by the frequency setting capacitor C.

During a pump period Tpump, the oscillating frequency setting current Icp is supplied from the differential amplifier 42 to the filter capacitor Cpump. The charge reset signal INIT, ramp control signal RAMP, and hold control signal HOLD supplied to the frequency detection circuit 40 are at identical levels between during a hold period Thold and during a pump period Tpump. For this reason, during a pump period Tpump, the voltage level of the frequency detection voltage Vcap is not caused to fluctuate by the frequency detection circuit 40.

Figure 12:
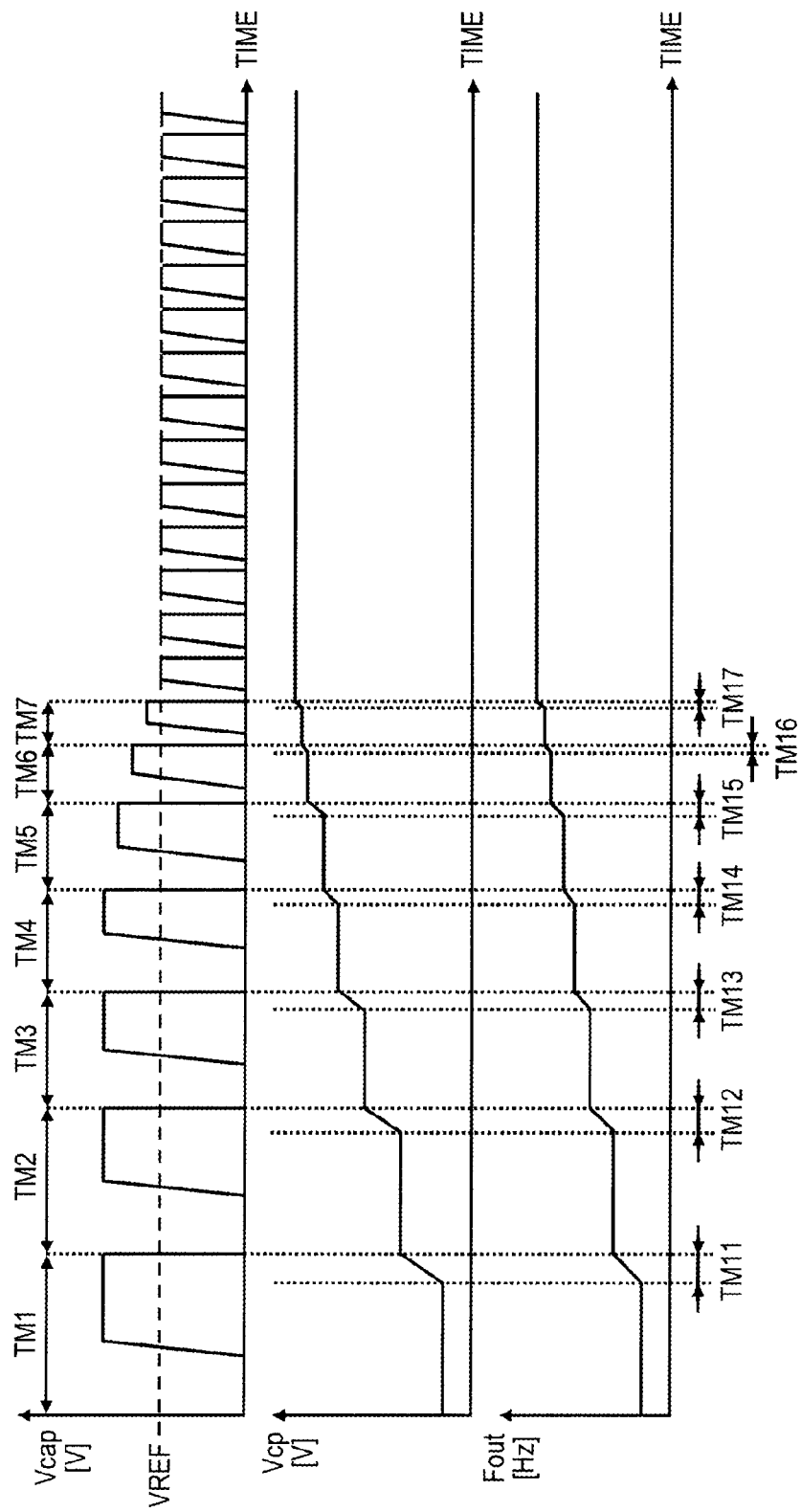
FIG. 12 is a timing chart indicating the operation of the oscillation circuit illustrated in FIG. 10.

Description will be given to the operation of the entire oscillation circuit 30b illustrated in FIG. 10. FIG. 12 is a timing chart indicating the operation of the oscillation circuit 30b illustrated in FIG. 10. The timing chart in FIG. 12 shows only fluctuation in the frequency detection voltage Vcap, oscillating frequency control voltage Vcp, and clock signal CLK. FIG. 12 is based on the assumption that the operation of the oscillation circuit 30b is started at the origin of the time axis (horizontal axis).

As shown in FIG. 12, the oscillation circuit 30b increases the oscillating frequency control voltage Vcp during each of periods TM1 to TM7. Each of the periods TM1 to TM7 includes a set of the charge reset period Tinit, ramp period Tramp, hold period Thold, and pump period Tpump shown in FIG. 11. Since the frequency of the clock signal CLK is increased during each period, the period TM1 to the period TM7 are gradually shortened. This is because the timing control signal is generated based on the period of the clock signal CLK. The periods TM11 to TM17 shown in FIG. 12 correspond to pump periods Tpump.

After the period TM7 passes, the high level-side voltage of the frequency detection voltage Vcap becomes substantially equal to the oscillation reference voltage VREF. As a result, at the oscillation circuit 30b, the oscillating frequency setting current Icp outputted by the differential amplifier 42 is substantially zeroed. For this reason, after the high level-side voltage of the frequency detection voltage Vcap becomes substantially equal to the oscillation reference voltage VREF, this state is maintained. Since the frequency detection voltage Vcap is kept at a constant voltage, the oscillating frequency of the clock signal CLK is also kept constant. That is, at the oscillation circuit 30b, jitter does not occur in the clock signal CLK after the oscillating frequency of the clock signal CLK reaches a target value.

According to the above description, in the oscillation circuit 30b, the filter capacitor Cpump generates the oscillating frequency control voltage Vcp according to the oscillating frequency setting current Icp. At this time, in the oscillation circuit 30b, the differential amplifier 42 outputs the oscillating frequency setting current Icp whose value continuously varies according to the voltage difference between the frequency detection voltage Vcap and the oscillation reference voltage VREF. More specific description will be given. When there is a voltage difference between the frequency detection voltage Vcap and the oscillation reference voltage VREF, the oscillating frequency setting current Icp has a magnitude corresponding to the voltage difference. When there is not a voltage difference between the frequency detection voltage Vcap and the oscillation reference voltage VREF, the oscillating frequency setting current Icp is substantially zeroed. In the oscillation circuit 30b, as a result, the following does not take place when the frequency of the clock signal CLK agrees with a target value (for example, when the frequency detection voltage Vcap agrees with the oscillation reference voltage VREF): the oscillating frequency control voltage Vcp does not fluctuate even when the pump control signal PULSE is brought into an enable state. In the oscillation circuit 30b, consequently, the voltage value of the oscillating frequency control voltage Vcp does not fluctuate after the oscillating frequency of the clock signal CLK agrees with a target value. Further, the oscillating frequency of the clock signal CLK determined by the oscillator 44 according to the voltage value of the oscillating frequency control voltage Vcp does not differ, either. That is, in the oscillation circuit 30b, jitter of the clock signal CLK can be reduced.

In the oscillation circuit 30b, the differential amplifier 43 has the switch circuit SW. This switch circuit SW is controlled into the open state during the other periods than a period for which the result of input signal difference voltage amplification by the differential amplifier 42 is reflected (for example, a pump period Tpump). In the oscillation circuit 30b, the frequency detection voltage Vcap takes a voltage value different from a voltage in which the clock signal CLK is reflected during a charge reset period Tinit and a ramp period Tramp. However, since the switch circuit SW is controlled into the open state during the other periods than a pump period, it is possible to prevent the following: deviation in the frequency detection voltage Vcap during a charge reset period Tinit and a ramp period Tramp can be prevented from being reflected in an oscillating frequency. In the oscillation circuit 30b, as a result, the oscillating frequency can be stabilized during any period.

An oscillating frequency is set on the oscillation circuit 30b based on the output current Iout outputted by the constant current generation circuit 1. For this reason, the following can be implemented when the coefficient of variation with temperature change of the output current Iout outputted by the constant current generation circuit 1 is substantially zero: the coefficient of variation with temperature variation of the oscillating frequency of the oscillation circuit 30b can also be substantially zeroed. In the constant current generation circuit 1, the current value of the output current Iout can be accurately set by trimming the current setting resistor Ri. In the oscillation circuit 30b, for this reason, the set value of the oscillating frequency of the clock signal CLK can be set with accuracy (for example, variation width of less than 1%) by taking the following measure: the accuracy of setting the current value of the output current Iout outputted by the constant current generation circuit 1 is enhanced.

In the microprocessor 2 in the second embodiment, according to the above description, the coefficient of variation with temperature variation and frequency of the clock signal CLK can be accurately set by taking the following measure: the output current Iout outputted by the constant current generation circuit 1 is used to set the frequency of the clock signal CLK. In the microprocessor 2 in the second embodiment, for example, the coefficient of variation with temperature variation and frequency of the clock signal CLK can be nestled within a range of deviation of 1% or so. The microprocessor 2 can operate based on such a highly accurate clock signal.

Figure 13:
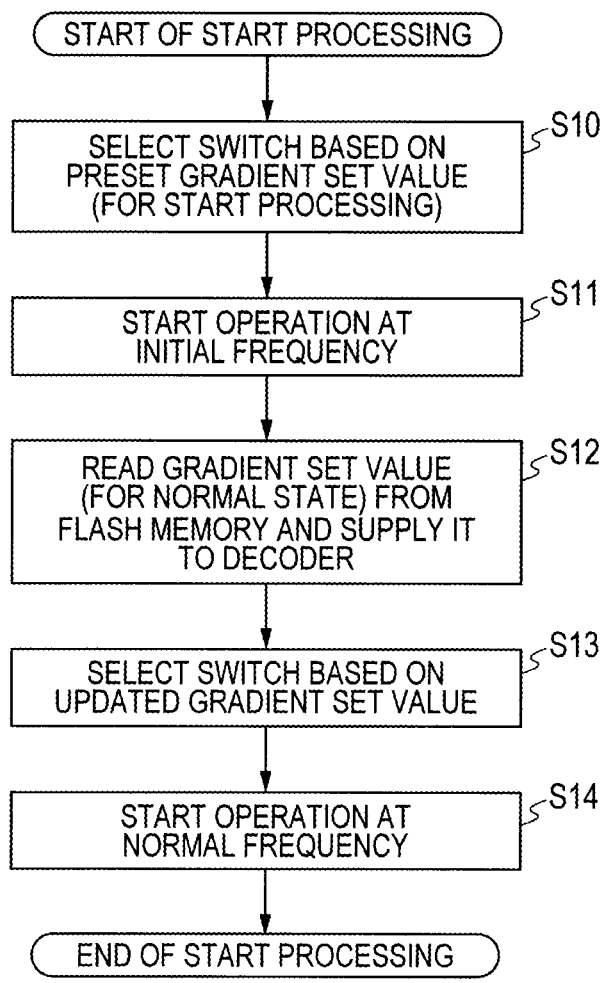
FIG. 13 is a flowchart illustrating a starting procedure for a microprocessor in the second embodiment.

Description will be given to a start sequence for the microprocessor 2 in the second embodiment. FIG. 13 is a flowchart illustrating a procedure for start processing for the microprocessor 2 in the second embodiment.

As illustrated in FIG. 13, when the microprocessor 2 starts the start processing, first, the decoder 23 selects any one switch based on a gradient set value stored beforehand in the memory 24 in the gradient control unit 22 (Step S10). As a result, the constant current generation circuit 1 starts operation and outputs the output current Iout. Then the oscillation circuit 30 generates the clock signal CLK based on the output current Iout. At this time, it is desirable that the gradient set value set at the time of startup should be such a value that the output current Iout is minimized. The reason for this is as described below. In the microprocessor 2, various voltages and circuits are in an unstable state in the initial stage after start. The possibility that trouble occurs in circuit operation is reduced by performing operation according to the clock signal CLK whose frequency is lower than that of the clock signal CLK generated in normal state.

Subsequently, the computing core PE reads a gradient set value utilized in normal state from the flash memory MEM and supplies the read gradient set value to the memory 24 of the gradient control unit 22 (Step S12). In the constant current generation circuit 1, the decoder 23 selects any one switch based on the updated gradient set value (Step S13). As a result, the constant current generation circuit 1 generates the output current Iout utilized in normal state. Then the oscillation circuit 30 changes the frequency of the clock signal CLK to a frequency for normal state based on the output current Iout in normal state (Step S14).

In the microprocessor 2 in the second embodiment, as described above, the generation of the output current Iout and the generation of the clock signal CLK are carried out based on a preset gradient set value for startup. After the microprocessor 2 starts operation based on the clock signal CLK, the generation of the output current Iout and the generation of the clock signal CLK are carried out based on a gradient set value utilized in normal state. Adoption of this starting procedure obviates the necessity for providing a means for storing a gradient set value utilized in normal state in the memory 24 in the constant current generation circuit 1. This is because gradient set values utilized in normal state can be stored in such a nonvolatile memory as a flash memory in which values can be relatively easily rewritten. The gradient set value used in start processing may be a value determined without taking temperature variation in the output current Iout or the like into account and can be set in a circuit design stage.

Third Embodiment

Figure 14:
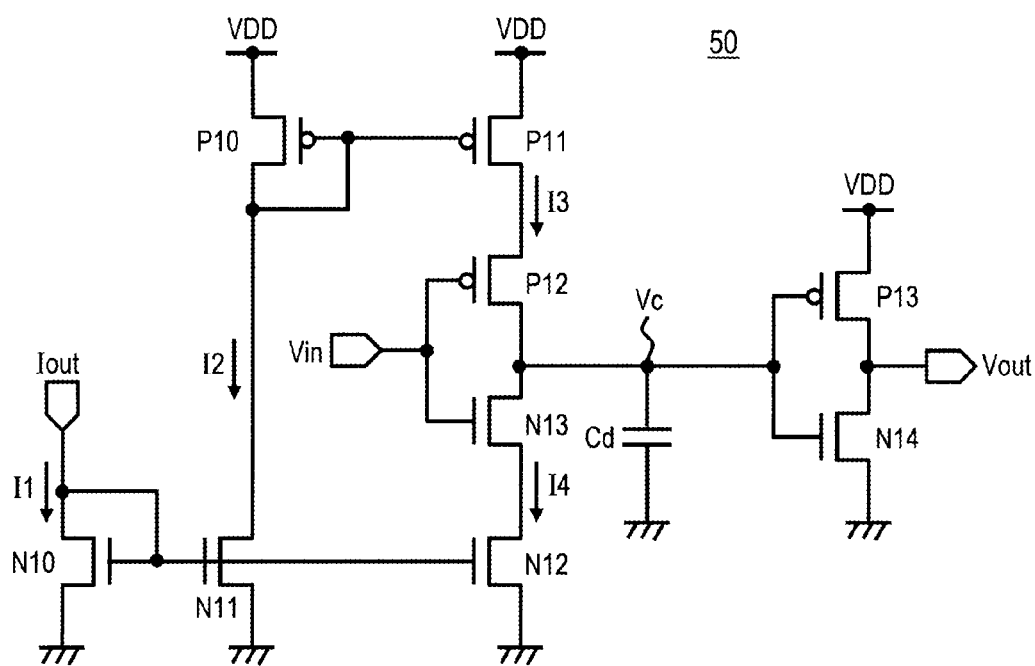
FIG. 14 is a circuit diagram of a delay circuit in a third embodiment.

In the description of the third embodiment, a delay circuit 50 that delays a signal with a delay amount determined by the current amount of the output current Iout generated by the constant current generation circuit 1 will be taken as an example. FIG. 14 is a circuit diagram of the delay circuit 50. As illustrated in FIG. 14, the delay circuit 50 includes NMOS transistors N10 to N14, PMOS transistors P10 to P13, and a capacitor Cd.

The NMOS transistor N10 has its source coupled to a ground terminal and has its drain and gate coupled together. The drain of the NMOS transistor N10 has the output current Iout of the constant current generation circuit 1 inputted thereto. This output current Iout will be hereafter referred to as current I1. The NMOS transistors N11, N12 form a current mirror circuit together with the NMOS transistor N10.

The PMOS transistor P10 has its source coupled to a ground terminal and has its drain and gate coupled together. The drain of the PMOS transistor P10 is coupled with the drain of the NMOS transistor N11. The drain of the PMOS transistor P10 has a current I2 flowing to the NMOS transistor N11 inputted thereto. This current I2 is generated by a current mirror comprised of the NMOS transistors N10, N11 based on the current I1. The PMOS transistor P11 forms a current mirror circuit together with the PMOS transistor P10.

The source of the NMOS transistor N13 is coupled to the drain of the NMOS transistor N12. The drain of the NMOS transistor N13 is coupled to the drain of the PMOS transistor P12. The source of the PMOS transistor P12 is coupled to the drain of the PMOS transistor P11. The gate of the NMOS transistor N12 and the gate of the PMOS transistor P12 are coupled to each other and these gates are supplied with an input signal Vin. The point of junction between the drain of the PMOS transistor P12 and the drain of the NMOS transistor N13 provides an intermediate output node (a node at which an intermediate voltage Vc is generated). Through the NMOS transistor N13, a current I4 generated by a current mirror circuit comprised of the NMOS transistors N10, N12 based on the current I1 is passed. Through the PMOS transistor N12, a current I3 generated by a current mirror circuit comprised of the PMOS transistors N10, N11 based on the current I2 is passed.

The capacitor Cd is coupled between the intermediate output node and a ground terminal. The source of the NMOS transistor N14 is coupled to a ground terminal. The drain of the NMOS transistor N14 is coupled to the drain of the PMOS transistor P13. The source of the PMOS transistor P13 is coupled to a power supply terminal. The gate of the NMOS transistor N14 and the gate of the PMOS transistor P13 are coupled to each other and the intermediate output node is coupled to these gates.

The point of junction between the drain of the PMOS transistor P12 and the drain of the NMOS transistor N13 is an output terminal of the delay circuit 50 and an output signal Vout is outputted therefrom. That is, the NMOS transistor N14 and the PMOS transistor P13 form an output inverter of the delay circuit 50.

Figure 15:
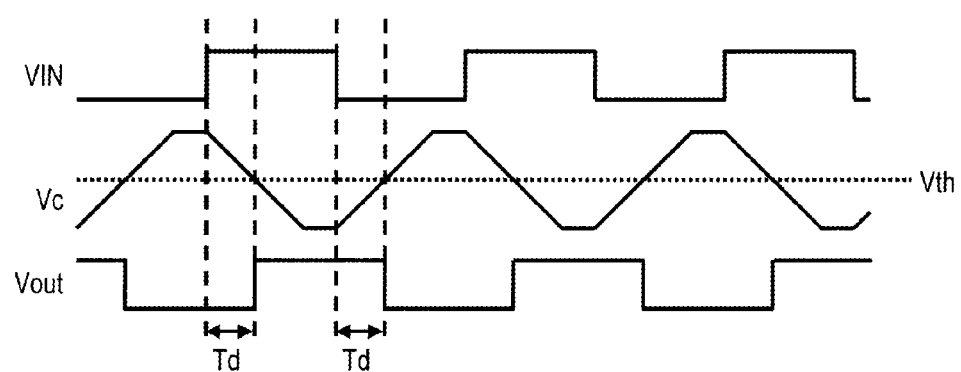
FIG. 15 is a timing chart indicating the operation of a delay circuit in the third embodiment.

Description will be given to the operation of the delay circuit 50. FIG. 15 is a timing chart indicating the operation of the delay circuit 50. In the delay circuit 50, as shown in FIG. 15, the NMOS transistor N13 is turned off and the PMOS transistor P12 is turned on during a period for which the input signal Vin is at the low level. Then electric charges are accumulated in the capacitor Cd by the current I3 passed by way of the PMOS transistor P12. As a result, the intermediate voltage Vc is gradually increased. When the intermediate voltage Vc thereafter becomes higher than the threshold voltage Vth of the output inverter, the output signal Vout falls.

In the delay circuit 50, the NMOS transistor N13 is turned on and the PMOS transistor P12 is turned off during a period for which the input signal Vin is at the high level. Then electric charges accumulated in the capacitor Cd are discharged by the current I4 passed by way of the NMOS transistor N13. As a result, the intermediate voltage Vc is gradually reduced. When the intermediate voltage Vc thereafter becomes lower than the threshold voltage Vth of the output inverter, the output signal Vout rises.

In the delay circuit 50, charging of the capacitor Cd is carried out by the current I3 and discharging of the capacitor Cd is carried out by the current I4. These currents I3, I4 are both generated by a current mirror circuit based on the current I1. When the current mirror ratio is 1:1 in any of the current mirror circuits, the currents I3, I4 have the same current value as the current I1. For this reason, the gradient at a rising edge of the intermediate voltage Vc and the gradient at a falling edge thereof can be expressed by $dVc/dt=Iout/C$.

In the delay circuit 50, according to the above description, the delay time Td is defined as follows: the time from a rising edge or a falling edge of the input signal Vin to when the intermediate voltage Vc gets across the threshold voltage Vth of the output inverter. That is, in the delay circuit 50, the delay time Td can be kept constant regardless of the temperature when the coefficient of variation with temperature variation of the output current Iout (current I1) is substantially zero. In the delay circuit 50, an accurate delay time Td can be set when the current value of the output current Iout is accurately set. This delay circuit 50 may be incorporated in the microprocessor 2 in the second embodiment.

When the delay circuit 50 is incorporated in the microprocessor 2, the circuit can be operated by the start processing illustrated in FIG. 13.

Fourth Embodiment

Figure 16:
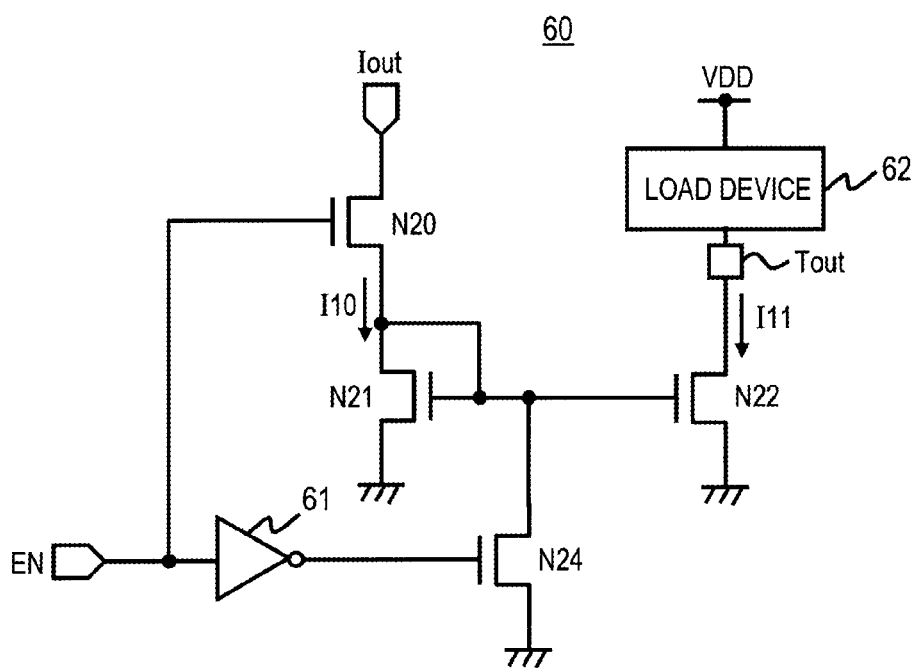
FIG. 16 is a circuit diagram of an output circuit in the third embodiment.
Figure 17:
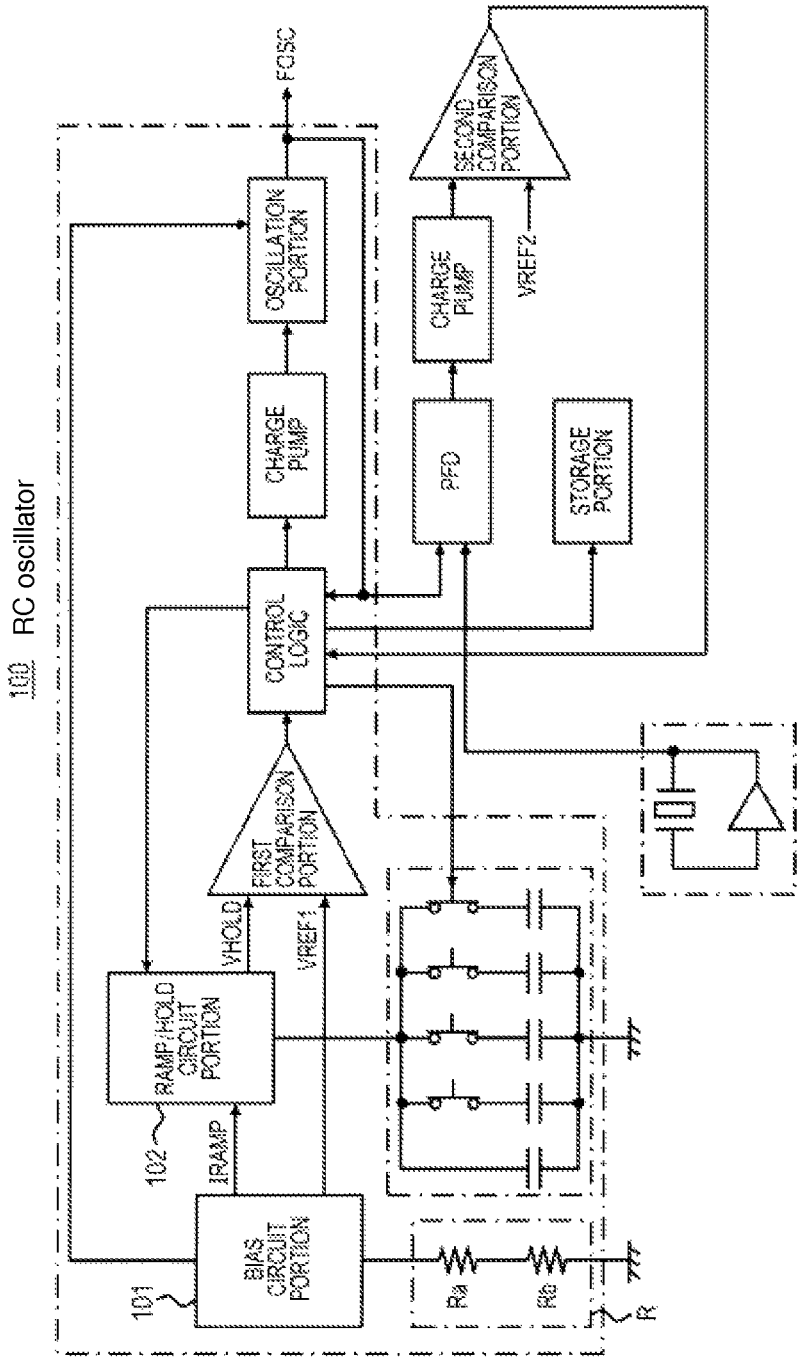
FIG. 17 is a block diagram of an RC oscillation circuit according to Patent Document 1.

In the description of the fourth embodiment, the following output circuit will be taken as an example: an output circuit 60 in which a driving current to be supplied to a load device is determined according to the current amount of the output current Iout generated by the constant current generation circuit 1. FIG. 16 is a circuit diagram of the output circuit 60. As illustrated in FIG. 16, the output circuit 60 includes an inverter 61 and NMOS transistors N20 to N24. The output circuit 60 drives a load device 62 coupled between an output terminal Tout and a power supply terminal with a driving current.

The NMOS transistor N20 has the output current Iout outputted by the constant current generation circuit 1 inputted to the drain thereof. The source of the NMOS transistor N20 is coupled to the drain of the NMOS transistor N21. The gate of the NMOS transistor N20 has an enable signal EN inputted thereto.

The drain of the NMOS transistor N21 is coupled with the gate of the NMOS transistor N21. The source of the NMOS transistor N21 is coupled to a ground terminal. The NMOS transistor N22 forms a current mirror circuit together with the NMOS transistor N21. The drain of the NMOS transistor N22 is coupled to the output terminal Tout.

The gate of the NMOS transistor N24 has an inversion signal of the enable signal EN inputted thereto through the inverter 61. The source of the NMOS transistor N24 is coupled to a ground terminal. The drain of the NMOS transistor N24 is coupled to the gate of the NMOS transistor N21.

Description will be given to the operation of the output circuit 60. In the output circuit 60, the NMOS transistor N20 is turned on and the NMOS transistor N24 is turned off when the enable signal EN is in an enable state (for example, high level). As a result, the output current Iout flows as a current I10 to the NMOS transistor N21. A current I11 is generated based on the current I10 by a current mirror circuit comprised of the NMOS transistors N21, N22. This current I11 becomes a driving current supplied to the load device 62.

In the output circuit 60, meanwhile, the NMOS transistor N20 is turned off and the NMOS transistor N24 is turned on when the enable signal EN is in a disenable state (for example, low level). As a result, the output current Iout is blocked at the NMOS transistor N20. Since the NMOS transistor N24 is on, the gates of the NMOS transistors N21, N22 are brought to ground voltage and a current mirror circuit comprised of the NMOS transistors N21, N22 is brought into a stopped state. That is, the current I11 does not flow.

In the output circuit 60, according to the above description, the driving current for driving the load device 62 is determined according to the output current Iout outputted by the constant current generation circuit 1. For this reason, the output circuit 60 can keep the driving current constant regardless of temperature variation when the coefficient of variation with temperature variation of the output current Iout is zero. Further, the output circuit 60 can keep the amplitude of voltage generated across the load device 62 constant regardless of temperature variation. In addition, the amplitude of voltage generated across the load device 62 can be accurately set by the constant current generation circuit 1 accurately setting the current value of the output current Iout and outputting it.

The invention is not limited to the above embodiments and can be appropriately modified without departing from the subject matter thereof.

What is claimed is:

1. A constant current generation circuit comprising:
   a temperature variable voltage generation unit generating a first variation voltage whose voltage value fluctuates with temperature;
   a reference voltage generation unit generating a reference variation voltage whose voltage value is smaller in an amount of variation with temperature than the first variation voltage;
   a variation gradient adjustment unit generating a second variation voltage based on the reference voltage and the first variation voltage; and
   a current generation unit including a current setting resistor whose resistance value fluctuates with temperature and generating a constant current determined by the second variation voltage and the current setting resistor,
   wherein the variation gradient adjustment unit sets the coefficient of variation with temperature of the second variation voltage so that the difference between the coefficient of variation with temperature thereof and the coefficient of variation with temperature of the resistance value of the current setting resistor is within a preset first stipulated range, and wherein the reference voltage generation unit generates the reference variation voltage independently of the variation gradient adjustment unit.

2. The constant current generation circuit according to claim 1, wherein the variation gradient adjustment unit includes at least either of:

a first gradient voltage generation unit that generates a plurality of first voltage; and a second gradient voltage generation unit that generates a plurality of second voltages, wherein each of the first voltages has a second temperature characteristic whose gradient is opposite to the gradient of a first temperature characteristic and the first voltages have coefficients of variation with temperature different from one another, wherein each of the second voltages has the gradient of the first temperature characteristic and the second voltages have coefficients of variation with temperature different from one another, wherein the variation gradient adjustment unit takes one voltage selected from among the first voltages as the second variation voltage when the first variation voltage has the gradient of the first temperature characteristic and the resistance value of the current setting resistor has the gradient of the second temperature characteristic, and wherein the variation gradient adjustment unit takes one voltage selected from among the second voltages as the second variation voltage when the first variation voltage and the resistance value of the current setting resistor have the gradient of the first temperature characteristic.

3. The constant current generation circuit according to claim 1, wherein the variation gradient adjustment unit includes a storage unit for storing a gradient set value for setting the gradient of the second variation voltage.

4. The constant current generation circuit according to claim 1, wherein the direction of variation in the resistance value of the current setting resistor and the direction of variation in the second variation voltage are identical with each other.

5. The constant current generation circuit according to claim 1, wherein the temperature variable voltage generation unit outputs the forward voltage of a diode as the first variation voltage, wherein the reference voltage is smaller in the amount of variation with temperature than the diode.

6. The constant current generation circuit according to claim 1, wherein the current generation unit includes:

a first transistor whose source is coupled to the first power supply terminal and whose drain is coupled to a second power supply terminal through the current setting resistor;

an error amplifier that supplies an error voltage to the gate of the first transistor based on the voltage difference between a current setting voltage generated at the node between the first transistor and the current setting resistor and the second variation voltage; and a second transistor coupled with the first transistor in a current mirror configuration, wherein the first transistor outputs a current to the current setting resistor so that a voltage generated across the current setting resistor based on the error voltage becomes the second variation voltage, and wherein the second transistor outputs as the constant current a current in proportion to a current passed through the current setting resistor by the first transistor.

7. The constant current generation circuit according to claim 1, comprising:

a reference voltage generation unit generating the reference voltage based on a band-gap voltage.

8. The constant current generation circuit according to claim 1, wherein the variation gradient adjustment unit includes a resistor, wherein the coefficient of variation with temperature of the second variation voltage is determined by the first variation voltage, the resistor and the reference variation voltage, and wherein if the coefficient of variation with temperature of the second variation voltage is different from the coefficient of variation with temperature of the resistance value of the current setting resistor, the variation gradient adjustment unit adjusts the coefficient of variation with temperature of the second variation voltage using the resistor such that the coefficient of variation with temperature of the second variation voltage is substantially equal the coefficient of variation with temperature of the resistance value of the current setting resistor.

9. The constant current generation circuit according to claim 3, wherein the gradient set value is a value at which the difference between the constant current at a first substrate temperature and the constant current at a second substrate temperature higher than the first substrate temperature is within a preset second stipulated range.

10. The constant current generation circuit according to claim 3, wherein the variation gradient adjustment unit includes:

an inverting amplifier whose amplification factor is set by first and second resistors and which takes the first variation voltage as input voltage; and a gradient control unit that changes the coefficient of variation of the second variation voltage based on the gradient set value, wherein the first and second resistors are each comprised of a plurality of resistors and an output tap is provided at each point of junction between the resistors, and wherein the gradient control unit switches the output tap for outputting the second variation voltage based on the gradient set value and thereby changes the coefficient of variation of the second variation voltage.

11. A microprocessor comprising:

a memory in which a program and a set value are stored;

a computing core carrying out computation processing based on the program stored in the memory; and a constant current generation circuit, wherein the constant current generation circuit includes:

a temperature variable voltage generation unit that generates a first variation voltage whose voltage value fluctuates with temperature;

a reference voltage generation unit generating a reference variation voltage whose voltage value is smaller in an amount of variation with temperature than the first variation voltage;

a variation gradient adjustment unit that generates a second variation voltage based on the reference voltage and the first variation voltage; and a current generation unit that includes a current setting resistor whose resistance value fluctuates with temperature and generates a constant current determined by the second variation voltage and the current setting resistor, wherein the variation gradient adjustment unit sets the coefficient of variation with temperature of the second variation voltage so that the difference between the coefficient of variation with temperature thereof and the coefficient of variation with temperature of the resistance value of the current setting resistor is within a preset first stipulated range, and wherein the reference voltage generation unit generates the reference variation voltage independently of the variation gradient adjustment unit.

12. The microprocessor according to claim 11,
wherein the variation gradient adjustment unit includes at least either of:
a first gradient voltage generation unit that generates a plurality of first voltages; and
a second gradient voltage generation unit that generates a plurality of second voltages,
wherein each of the first voltages has a second temperature characteristic whose gradient is opposite to the gradient of a first temperature characteristic and the first voltages have coefficients of variation with temperature different from one another,
wherein each of the second voltages has the gradient of the first temperature characteristic and the second voltages have coefficients of variation with temperature different from one another,
wherein the variation gradient adjustment unit takes one voltage selected from among the first voltages as the second variation voltage when the first variation voltage has the gradient of the first temperature characteristic and the resistance value of the current setting resistor has the gradient of the second temperature characteristic, and
wherein the variation gradient adjustment unit takes one voltage selected from among the second voltages as the second variation voltage when the first variation voltage and the resistance value of the current setting resistor have the gradient of the first temperature characteristic.

13. The microprocessor according to claim 11, further comprising:
an oscillation circuit that outputs a clock signal having an oscillating frequency determined by the constant current generated by the constant current generation circuit.

14. The microprocessor according to claim 11, further comprising:
a delay circuit whose delay time is set based on the constant current generated by the constant current generation circuit.

15. The microprocessor according to claim 11, further comprising:
an output circuit having a load driving current determined by the constant current generated by the constant current generation circuit.

16. The constant current generation circuit according to claim 11,
wherein the variable voltage generation unit comprises a diode,
wherein the reference voltage is smaller in the amount of variation with temperature than the diode.

17. The microprocessor according to claim 13,
wherein the variation gradient adjustment unit includes a storage unit for storing a gradient set value for setting the gradient of the second variation voltage,
wherein the constant current generation circuit generates the constant current based on a preset initial gradient set value,
wherein the oscillation circuit generates the output signal based on the constant current generated based on the initial gradient set value,
wherein the computing core operates based on the output signal outputted by the oscillation circuit and reads the gradient set value from the memory and writes the gradient set value in the storage unit of the gradient adjustment unit, and
wherein after the gradient adjusted value is set in the storage unit, the constant current generation circuit generates the constant current based on the set gradient adjusted value.

18. The microprocessor according to claim 13,
wherein the oscillation circuit has a transistor that receives the constant current from the constant current generation circuit.

19. A constant current generation circuit comprising:
a temperature variable voltage generation unit that includes an output node to provide a first variation voltage having a first temperature characteristic;
a reference voltage generation unit generating a reference variation voltage whose voltage value is smaller in an amount of variation with temperature than the first variation voltage;
a variation gradient adjustment unit that includes a first transistor, a first resistor, a second resistor and a first amplifier and an output node to provide a second variation voltage having a second temperature characteristic, the first transistor, the first resistor and the second resistor being coupled in series between a first power supply and the output node of the temperature variable voltage generation unit, a first input of the first amplifier being coupled to the reference voltage, a second input of the first amplifier being coupled to a node between the first resistor and the second resistor, an output of the first amplifier being coupled to a gate of the first transistor, the second variation voltage being determined by the first resistor, the second resistor, the reference voltage and the first variation voltage; and
a current generation unit that includes a second transistor, a third transistor, a second amplifier, and a current setting resistor having a third temperature characteristic and outputs a constant current, the second transistor and the current setting resistor being coupled in series between the first power supply and a second power supply, a first input of the second amplifier being coupled to the output node of the variation gradient adjustment unit, a second input of the second amplifier being coupled to a node between the second transistor and the current setting resistor, an output of the second amplifier being coupled to a gate of the second transistor, the third transistor being coupled to the second transistor in a current mirror configuration so as to output the constant current, and
wherein the reference voltage generation unit generates the reference variation voltage independently of the variation gradient adjustment unit.

20. The constant current generation circuit according to claim 19, wherein a difference between the second temperature characteristic and the third temperature characteristic is within a predetermined range.

21. The constant current generation circuit according to claim 19, wherein the temperature variable voltage generation unit comprises a diode, and the reference voltage is smaller in the amount of variation with temperature than the diode.

22. The constant current generation circuit according to claim 20, wherein the first resistor comprises a variable resistor and a resistance value of the variable resistor is determined so that the difference between the second temperature characteristic and the third temperature characteristic is within a predetermined range.

23. The constant current generation circuit according to claim 22, wherein the variable resistor comprises a plurality of resistors and a plurality of output taps is provided at both ends of the resistors, and wherein one of the plurality of output taps is selected so that the difference between the second temperature characteristic and the third temperature characteristic is within a predetermined range.

24. A semiconductor device comprising:
- a voltage generation circuit configured to generate a reference voltage based on a bandgap voltage;
- a first amplifier having a non-inverting terminal, an inverting input terminal configured to receive the reference voltage, and an output terminal;
- a first power supply terminal;
- a second power supply terminal;
- a first MOS transistor having a source coupled to the first power supply terminal, a gate coupled to the output terminal of the first amplifier, and a drain;
- a first resistor having one end coupled to the drain of the first MOS transistor and the other end coupled to the non-inverting terminal of the first amplifier, and including a plurality of resistors coupled in series;
- a second resistor having one end coupled to the other end of the first resistor and the other end, and including a plurality of resistors coupled in series;
- a diode having an anode coupled to the other end of the second resistor and a cathode coupled to the second power supply terminal, the diode being provided at the anode a first varying voltage that varies the voltage value with respect to the temperature;
- a second amplifier including an inverting terminal, a non-inverting terminal, and an output terminal;
- a second MOS transistor having a source coupled to the first power supply terminal, a gate coupled to the output terminal of the second amplifier and a drain coupled to the non-inverting terminal of the second amplifier;
- a third resistor coupled between the second power supply terminal and the drain of the second MOS transistor, a resistance of the third resistor being varied with respect to the temperature;
- a third MOS transistor having a source coupled to the first power supply terminal, a gate coupled to the output terminal of the second amplifier, and a drain outputting an output current;
- a plurality of switches coupled between one end of each resistor, each connection point of the plurality of resistors leading to the inverting terminal of the second amplifier, respectively, and configured to output to the inverting terminal of the second amplifier a second varying voltage that varies with respect to the temperature; and
- a control circuit including data for connection of one of the plurality of switches.

25. A semiconductor device according to claim 24, wherein the data is set so that the rate of change of the second variation voltage with respect to the temperature is to match the rate of change in the resistance of the third resistance with respect to the temperature.

26. The semiconductor device according to claim 25, further comprising:
- an oscillator coupled to receive the output current and configured to generate a clock signal whose frequency is determined based on the output current;
- a memory coupled to the clock signal and configured to store a program and the data to be sent to the control circuit therein; and
- a computing core coupled to the clock signal and configured to execute computation processing based on the program stored in the memory.

27. The semiconductor device according to claim 25, wherein the first varying voltage has a negative temperature characteristic, wherein the third resistor has the positive or negative temperature characteristic, wherein the voltages at the points of each of the plurality of resistance of the first resistor have positive temperature characteristics and the slopes thereof are different from each other with respect to the temperature, and wherein the voltages at the points of each of the plurality of resistance of the second resistor have negative temperature characteristics and the slopes thereof are different from each other with respect to the temperature.

* * * * *